United States Patent
Higashida et al.

(10) Patent No.: US 11,195,783 B2
(45) Date of Patent: Dec. 7, 2021

(54) SEMICONDUCTOR DEVICE

(71) Applicant: Rohm Co., Ltd., Kyoto (JP)

(72) Inventors: Yoshio Higashida, Kyoto (JP); Katsutoki Shirai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/429,555

(22) Filed: Jun. 3, 2019

(65) Prior Publication Data

US 2019/0378784 A1    Dec. 12, 2019

(30) Foreign Application Priority Data

Jun. 7, 2018 (JP) .............................. JP2018-109185

(51) Int. Cl.
  *H01L 23/495* (2006.01)
  *H01L 23/31* (2006.01)
  (Continued)

(52) U.S. Cl.
  CPC .... *H01L 23/49555* (2013.01); *H01L 23/3107* (2013.01); *H01L 23/49513* (2013.01);
  (Continued)

(58) Field of Classification Search
  CPC ......... H01L 23/49555; H01L 23/49562; H01L 23/49575; H01L 23/49513; H01L 23/3107; H01L 23/5283; H01L 24/49; H01L 24/09; H01L 23/5226; H01L 2224/45144; H01L 2224/45147; H01L 2224/45124; H01L 2224/05599; H01L 2224/29199; H01L 2224/06131; H01L 2224/06133; H01L 2224/06177; H01L 2224/05553; H01L 24/06; H01L 24/05; H01L 2224/04042;
  (Continued)

(56) References Cited

U.S. PATENT DOCUMENTS

2004/0217488 A1* 11/2004 Luechinger ........... H01L 23/498
                                                                        257/784
2007/0018338 A1*  1/2007 Hosseini ................. H01L 24/78
                                                                        257/784
(Continued)

FOREIGN PATENT DOCUMENTS

JP        2007-67332 A      3/2007

*Primary Examiner* — Samuel Park
(74) *Attorney, Agent, or Firm* — Hamre, Schumann, Mueller & Larson, P.C.

(57) ABSTRACT

A semiconductor device includes a semiconductor element made up of a semiconductor substrate, an element electrode formed on the substrate, and a wiring layer electrically connected to the element electrode. The semiconductor device further includes a lead frame supporting the semiconductor element, a first conductive member electrically connecting the semiconductor element and the lead frame, a second conductive member overlapping with the semiconductor element as seen in plan view, and a sealing resin covering the semiconductor element, a part of the lead frame, and the first and second conductive member. The wiring layer includes a first pad portion and a second pad portion. The second conductive member has a first connecting portion bonded to the first pad portion and a second connecting portion bonded to the second pad portion.

18 Claims, 20 Drawing Sheets

(51) Int. Cl.
  *H01L 23/528* (2006.01)
  *H01L 23/00* (2006.01)
  *H01L 23/522* (2006.01)

(52) U.S. Cl.
  CPC .. *H01L 23/49562* (2013.01); *H01L 23/49575* (2013.01); *H01L 23/5226* (2013.01); *H01L 23/5283* (2013.01); *H01L 24/09* (2013.01); *H01L 24/49* (2013.01)

(58) Field of Classification Search
  CPC . H01L 2224/73265; H01L 2224/48464; H01L 2224/48472; H01L 24/45; H01L 2224/49171; H01L 2224/4912; H01L 2224/49113; H01L 2224/49176; H01L 2224/49177; H01L 24/48; H01L 2224/48247; H01L 2224/4813; H01L 24/29; H01L 24/32; H01L 2224/32245; H01L 2224/29294; H01L 2224/293; H01L 2224/29339; H01L 23/528; H01L 2224/4903; H01L 23/49531; H01L 23/495; H01L 23/49861; H01L 23/31; H01L 23/4952; H01L 23/49503; H01L 24/73; H01L 23/49582; H01L 24/83; H01L 24/03; H01L 24/85; H01L 23/49524
  See application file for complete search history.

(56) References Cited

U.S. PATENT DOCUMENTS

| | | | |
|---|---|---|---|
| 2007/0057350 A1* | 3/2007 | Otremba | H01L 24/73 257/666 |
| 2008/0128755 A1* | 6/2008 | Fukamizu | H01L 24/06 257/203 |
| 2014/0151794 A1* | 6/2014 | Lotfi | H01L 27/088 257/337 |
| 2014/0284784 A1* | 9/2014 | Yasunaga | H01L 23/4334 257/690 |
| 2015/0084135 A1* | 3/2015 | Miura | H01L 23/4824 257/401 |
| 2015/0084530 A1* | 3/2015 | Kitamura | H02M 7/06 315/200 R |
| 2015/0263002 A1* | 9/2015 | Matsumoto | H01L 29/7786 257/76 |
| 2016/0307854 A1* | 10/2016 | Matsubara | H01L 21/56 |
| 2018/0331210 A1* | 11/2018 | Mori | H01L 29/0623 |
| 2020/0274497 A1* | 8/2020 | Matsui | H03F 1/26 |

* cited by examiner

SEMICONDUCTOR DEVICE

FIELD

The present disclosure relates to semiconductor devices.

BACKGROUND

JP-A-2007-67332 discloses a conventional semiconductor device that includes a semiconductor substrate, insulating films, wiring layers and bonding wires. The semiconductor substrate may be made of silicon and serves as a base for fabricating a device element. The device element may be any type of transistor, including a MOS transistor. The insulating films are formed over the semiconductor substrate. The wiring layers are connected to the device element. Specifically, the wiring layers include a lower wiring layer, an upper wiring layer and a copper wiring layer. The upper and lower wiring layers are each covered by an insulating film. The copper wiring layer is not covered by an insulating film and forms surface wiring to which the bonding wires are bonded. The bonding wires are bonded to the edges of the surface wiring (copper wiring) layer.

For a conventional semiconductor device configured as above, the area of surface wiring tends to increase with the size of the device element. When the area of surface wiring is increased, the length of the current path through the surface wiring is also increased. As a result, the internal resistance of the semiconductor device increases, which can be a factor causing electricity loss.

SUMMARY

The present disclosure has been conceived in view of the above issues and aims to provide a semiconductor device configured to have a lower internal resistance.

A first aspect of the present disclosure provides a semiconductor device that includes a semiconductor element, a lead frame, a first conductive member, a second conductive member and a sealing resin. The semiconductor element may include a semiconductor substrate, an element electrode and a wiring layer, where the semiconductor substrate has a substrate main surface and a substrate rear surface that are spaced apart from each other in a first direction, the element electrode is formed on the substrate main surface, and the wiring layer is formed on the substrate main surface and electrically connected to the element electrode. The lead frame supports the semiconductor element. The first conductive member electrically connects the semiconductor element and the lead frame. The second conductive member overlaps with the semiconductor element as viewed in the first direction. The sealing resin covers the semiconductor element, a part of the lead frame, the first conductive member and the second conductive member. The wiring layer includes a first pad portion and a second pad portion that are spaced apart from each other. The second conductive member has a first connecting portion bonded to the first pad portion and a second connecting portion bonded to the second pad portion.

A second aspect of the present disclosure provides a semiconductor device that includes a semiconductor element, a lead frame, a conductive member and a sealing resin. The semiconductor element includes a semiconductor substrate, an element electrode and a wiring layer, where the semiconductor substrate has a substrate main surface and a substrate rear surface that are spaced apart from each other in a first direction, the element electrode is formed on the substrate main surface, and the wiring layer is formed on the substrate main surface and electrically connected to the element electrode. The lead frame supports the semiconductor element. The conductive member electrically connects the semiconductor element and the lead frame. The sealing resin covers the semiconductor element, a part of the lead frame and the conductive member. The wiring layer includes a rectangular plate-like member elongated in a second direction perpendicular to the first direction. The conductive member has a connecting portion bonded to the plate-like member, where the connecting portion is elongated in a longitudinal direction of the plate-like member as viewed in the first direction and overlaps with a longitudinal center of the plat-like member as viewed in the first direction.

Further features and advantages of the present disclosure will become apparent from the following detailed description with reference to the attached drawings.

DRAWINGS

EMBODIMENTS

Figure 1:
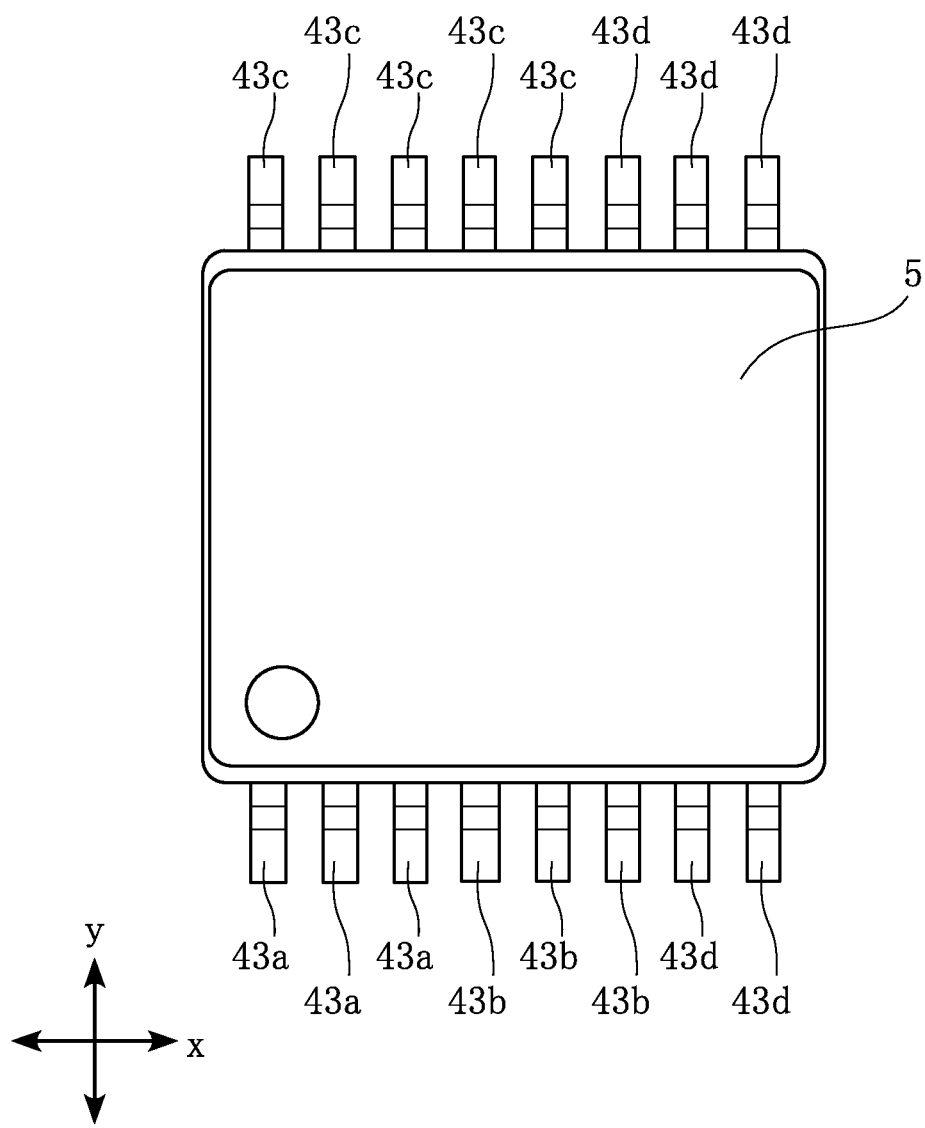
FIG. 1 is a plan view of a semiconductor device according to a first embodiment.

Preferred embodiments of semiconductor devices according to the present disclosure will be described below, with reference to the accompanying drawings.

FIGS. 1 to 9 show a semiconductor device A1 according to a first embodiment. As seen from FIG. 4, for example, the semiconductor device A1 includes first semiconductor elements 1, a second semiconductor element 2, first conductive members 31, second conductive members 32, third conductive members 33, a lead frame 4 and a sealing resin 5.

Figure 2:
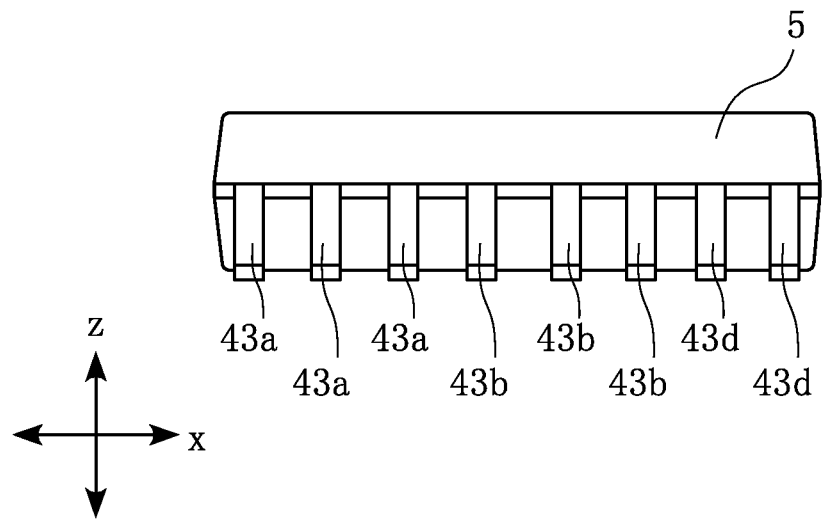
FIG. 2 is a front view of the semiconductor device according to the first embodiment.
Figure 3:
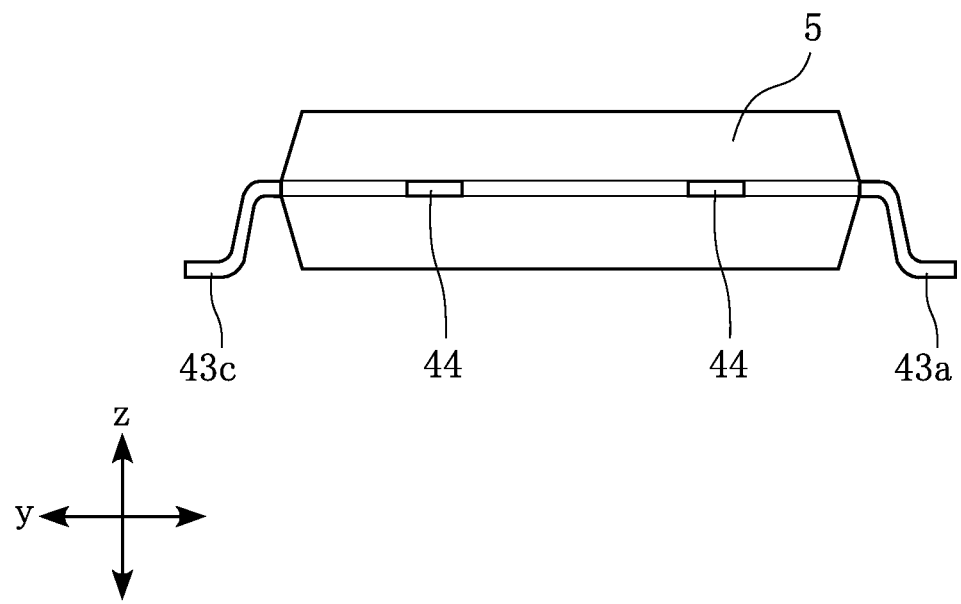
FIG. 3 is a side view of the semiconductor device according to the first embodiment.
Figure 4:
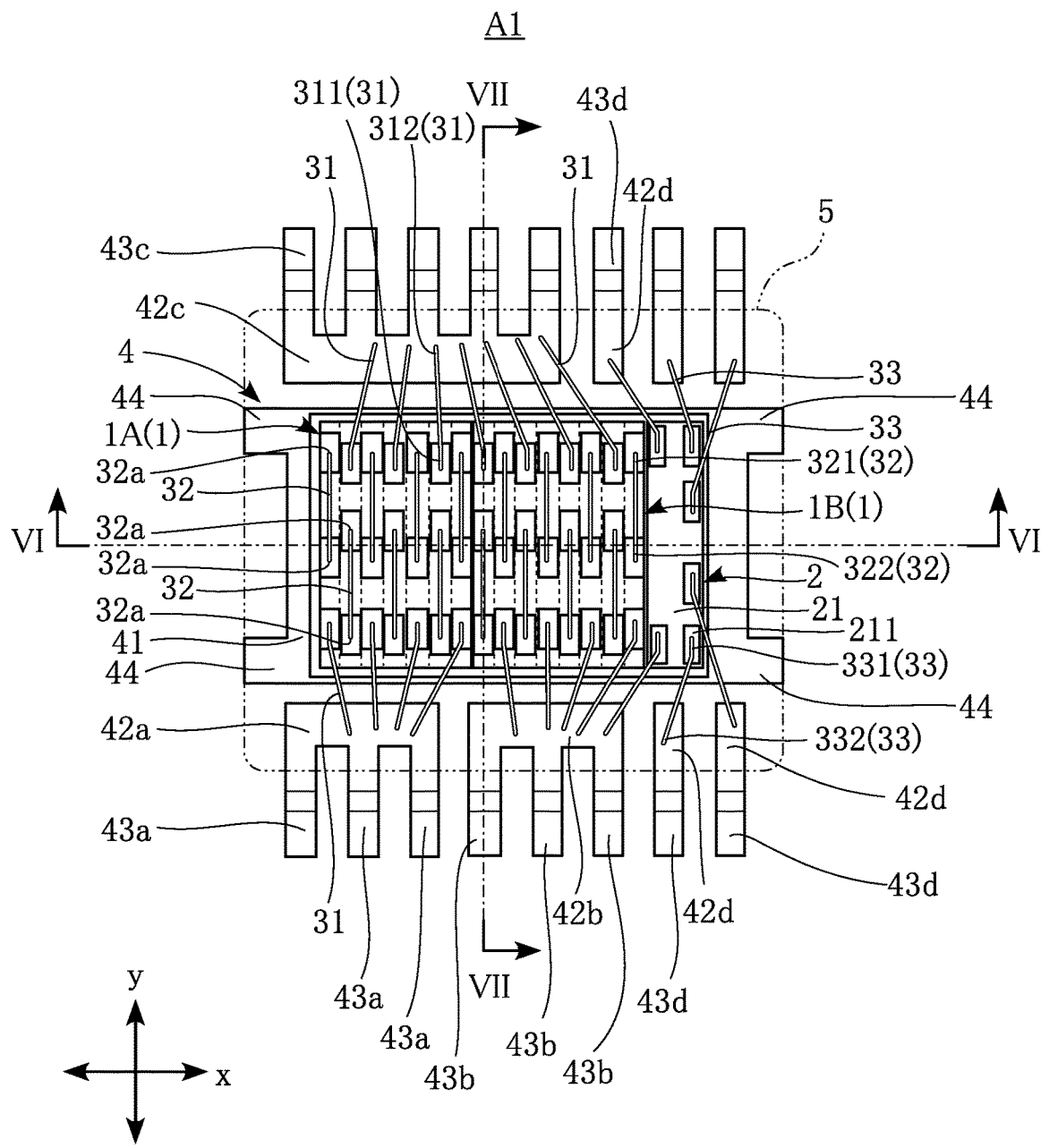
FIG. 4 is a plan view corresponding to FIG. 1, omitting a sealing resin 5.
Figure 5:
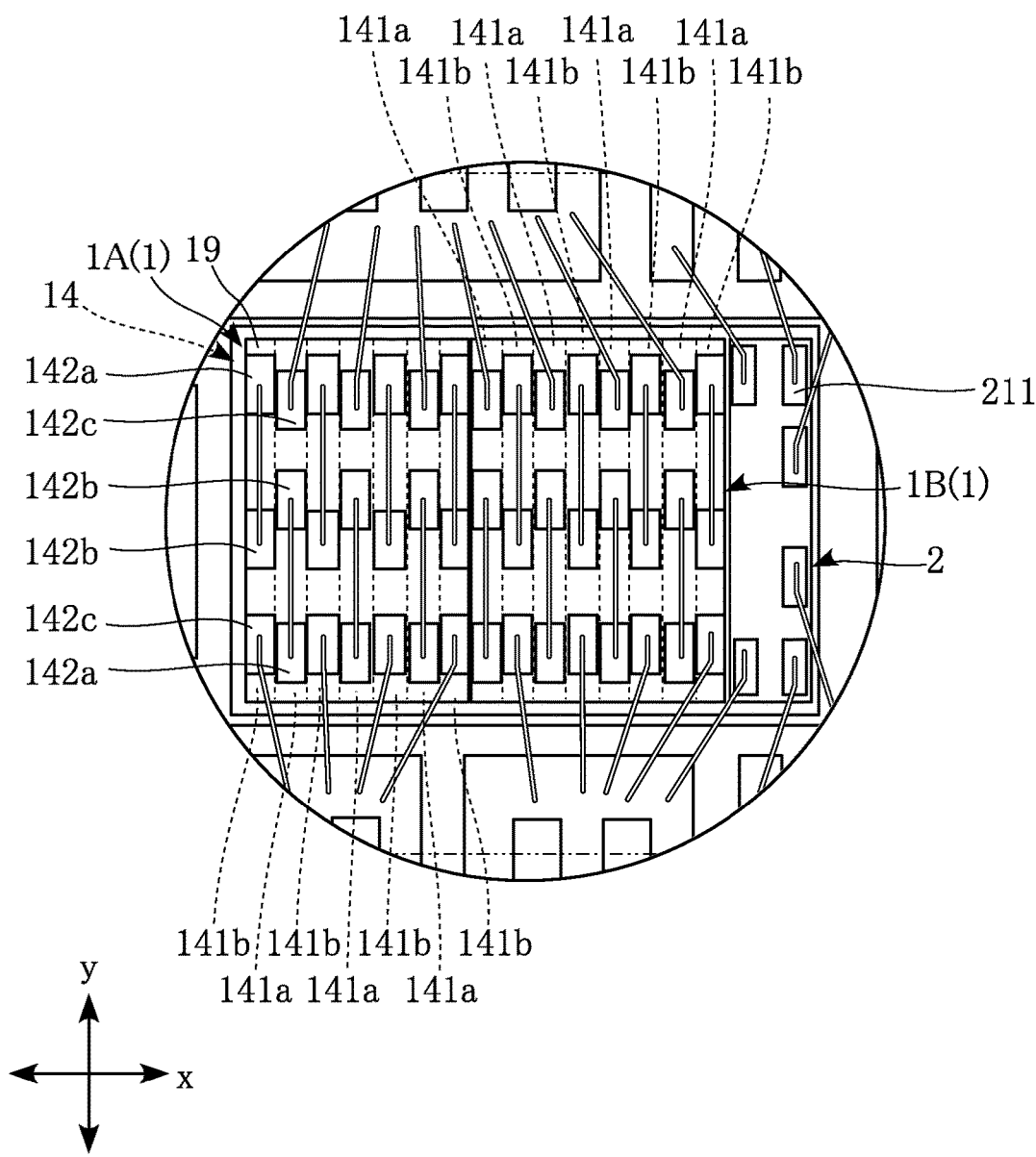
FIG. 5 is an enlarged fragmentary view of FIG. 4.
Figure 6:
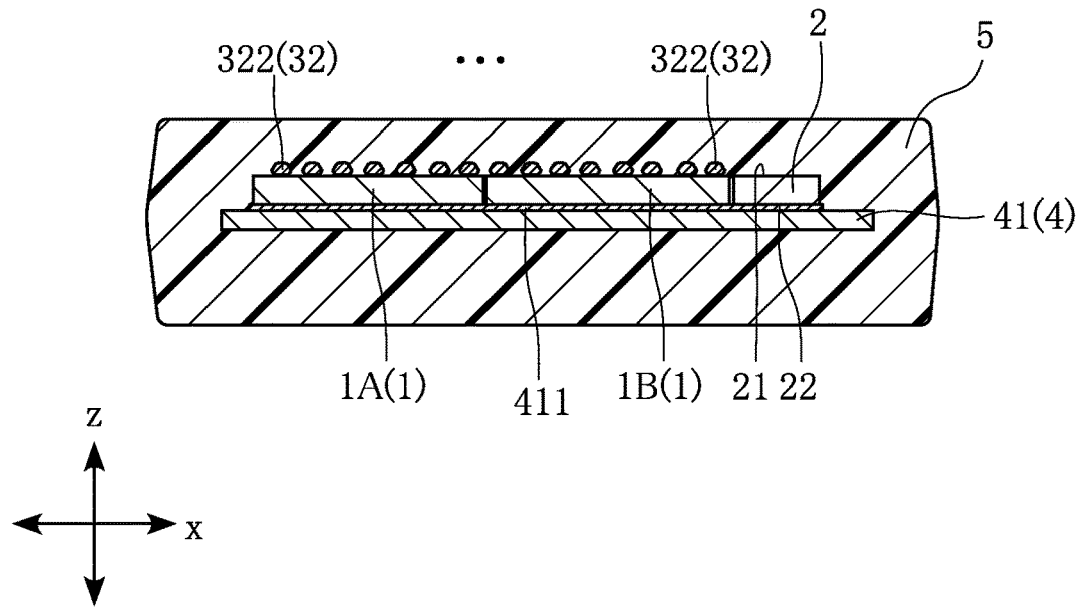
FIG. 6 is a sectional view taken along line VI-VI of FIG. 4.
Figure 7:
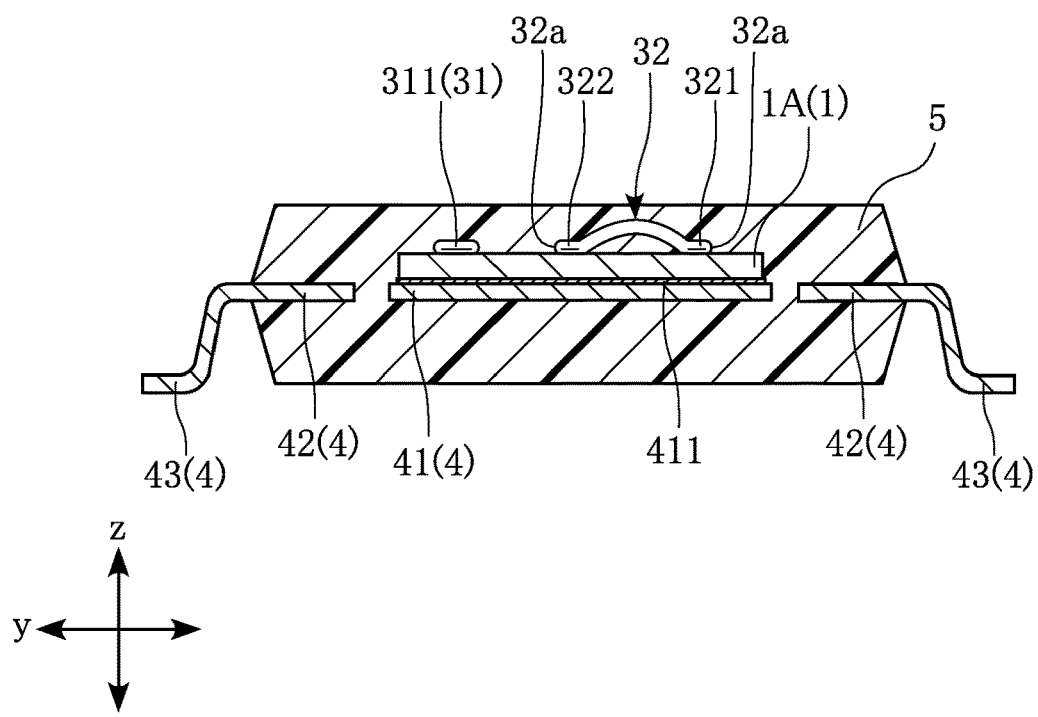
FIG. 7 is a sectional view taken along line VII-VII of FIG. 4.

FIG. 1 is a plan view of the semiconductor device A1. FIG. 2 is a front view of the semiconductor device A1. FIG. 3 is a side view of the semiconductor device A1. FIG. 4 corresponds to FIG. 1, but the sealing resin 5 is shown in phantom by dash-double dot lines. FIG. 5 is an enlarged fragmentary view of FIG. 4. FIG. 6 is a sectional view taken along line VI-VI of FIG. 4. FIG. 7 is a sectional view taken along line VII-VII of FIG. 4. For the purpose of deception, three directions orthogonal to each other are defined as x, y and z directions. Specifically, the z direction refers to the thickness direction of the semiconductor device A1. The x direction and the y direction respectively refer to the lateral and vertical directions as seen in the plan view (see FIG. 1) of the semiconductor device A1.

The semiconductor device A1 is designed for surface mounting on a circuit board of various electronic devices. In this embodiment, the semiconductor device A1 is a semiconductor package called a small outline package (SOP). The semiconductor device A1 may be, but not limited to, a power IC.

The first semiconductor elements 1 and the second semiconductor element 2 are essential components for the functions of the semiconductor device A1. Each first semiconductor element 1 is a power semiconductor element, which in this embodiment is a lateral MOSFET, for example. However, neither of the first semiconductor elements 1 is limited to MOSFET. The semiconductor device A1 includes two first semiconductor elements 1. For convenience, the two first semiconductor elements 1 may be referred to separately as a first semiconductor element 1A and a first semiconductor element 1B. The first semiconductor elements 1A and 1B are adjacent to each other in the x direction, and the first semiconductor element 1B is located between the first semiconductor element 1A and the second semiconductor element 2. The second semiconductor element 2 is a control IC for the first semiconductor elements 1. The second semiconductor element 2 is electrically connected to each first semiconductor element 1 to control the operation of the first semiconductor element 1. Each of the first semiconductor elements 1A and 1B and the second semiconductor element 2 is rectangular as viewed in the z direction (or in plan view). In addition, the combined shape of the first semiconductor elements 1A and 1B and the second semiconductor element 2 is also rectangular in plan view. This means that the y-direction dimensions of the first semiconductor elements 1A and 1B and the second semiconductor element 2 are substantially the same. The combined shape of the first semiconductor elements 1A and 1B and the second semiconductor element 2 measures 3 mm in the x direction and 2 mm in the y direction.

Figure 8:
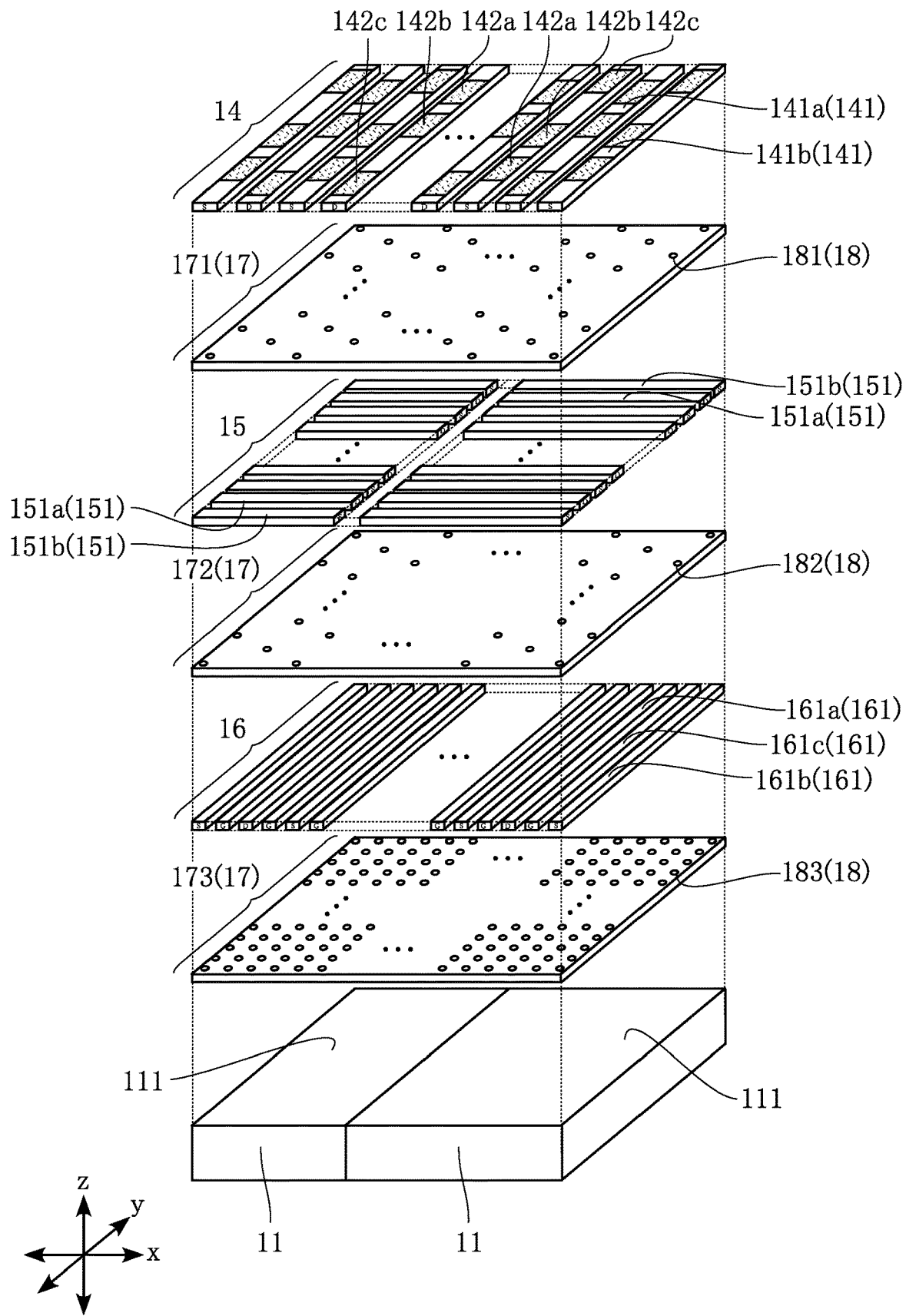
FIG. 8 is an exploded perspective view of first semiconductor elements.
Figure 9:
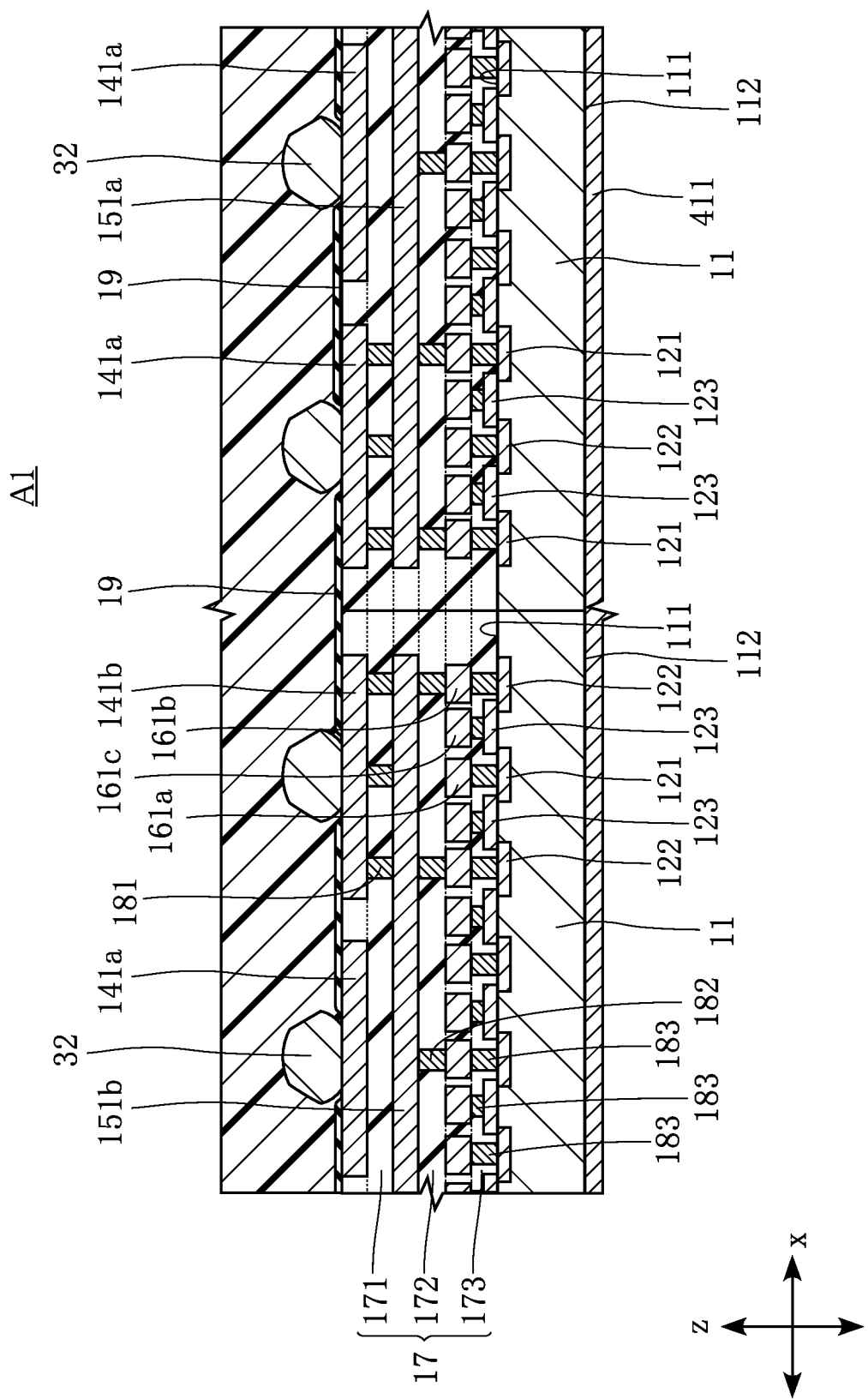
FIG. 9 is an enlarged sectional view of FIG. 6.

FIGS. 8 and 9 show the detailed configuration of the first semiconductor elements 1. Specifically, FIG. 8 is a exploded perspective view of the first semiconductor elements 1, showing the wiring layers, the insulating layers 17 and the vias 18. In FIG. 8, the element electrodes and the protective layer 19 are omitted, in addition to part of the insulating layers 17. FIG. 9 is an enlarged fragmentary view of FIG. 6. As shown in these figures, each first semiconductor element 1 includes a semiconductor substrate 11, element electrodes (121, 122, 123), wiring layers (14, 15, 16), insulating layers 17, vias 18 (181, 182, 193) and a protective layer 19. Note that the first semiconductor elements 1A and 1B may have a single common semiconductor substrate 11, instead of two separate semiconductor substrates 11.

The semiconductor substrate 11 is made of a semiconductor material, such as silicone (Si), silicon carbide (SiC) or gallium nitride (GaN). In this embodiment, one of the first semiconductor elements 1 (first semiconductor element 1A) is an n-channel MOSFET, whereas the other (first semiconductor element 1B) is a p-channel MOSFET. As shown in FIG. 9, the semiconductor substrate 11 has a substrate main surface 111 and a substrate rear surface 112 that are opposite to each other in the z direction.

As shown in FIG. 9, the element electrodes are exposed on the substrate main surface 111 of the semiconductor substrate 11. The element electrodes of each first semiconductor element 1 include first electrodes 121, second electrodes 122 and third electrodes 123. In the illustrated example, each element electrode has a flat, rectangular upper surface which is exposed from the substrate 11, while the remaining portions of the electrode are embedded in the substrate 11. In this embodiment, the first electrodes 121 are drain electrode, the second electrodes 122 are source electrodes, and the third electrodes 123 are gate electrodes. The layout of the first electrodes 121, the second electrodes 122 and the third electrodes 123 in plan view is not specifically limited. For example, the element electrodes may be arranged in a grid or in a row elongated in the x or y direction.

As shown in FIGS. 8-9, the wiring layers are formed above the substrate main surface 111 of the semiconductor substrate 11 and electrically connected to the element electrodes. Specifically, the wiring layers includes, but not limited to, three conductive layers, namely a first conductive layer 14, a second conductive layer 15 and a third conductive layer 16. The first conductive layer 14, the second conductive layer 15 and the third conductive layer 16 are spaced apart from each other in the z direction and insulated by insulating layers 17.

The first conductive layer 14 is the outermost layer among the wiring layers. That is, the first conductive layer 14 is located farther from the substrate 11 than the second conductive layer 15 and the third conductive layer 16 in the z direction. The first conductive layer 14 includes a plurality of first plate-like members 141.

The first plate-like members 141 are made of a conductive material, such as aluminum (Al) or copper (Cu). In this embodiment, the first plate-like members 141 are made of Al. Each first plate-like member 141 is rectangular plan view and has a longitudinal direction extending in the y direction. Each first plate-like member 141 may have a width (short-direction dimension) of about 150 μm and a thickness (z-direction dimension) of about 3 μm. The first plate-like members 141 are arranged side by side in the x direction in plan view. In FIGS. 4 and 5, each first plate-like member 141 is shown in contact with an adjacent first plate-like member 141 in the x direction. In practice, however, each two adjacent first plate-like members 141 are separated by an insulating layer 17. That is, the first plate-like members 141 of the first conductive layer 14 are insulated from each other by the insulating layers 17. As shown in FIG. 5, each first plate-like member 141 has a first pad portion 142a, a second pad portion 142b and a third pad portion 142c, each of which is exposed from the protective layer 19. In FIG. 8, the first pad portions 142a, the second pad portions 142b and the third pad portions 142c are shaded with dots for clarity.

The first pad portion 142a, the second pad portion 142b and the third pad portion 142c of each first plate-like member 141 are regions in the same plane. In addition, the first pad portion 142a, the second pad portion 142b and the third pad portion 142c of each first plate-like member 141 are aligned in the y direction in a spaced relation. In this embodiment, the second pad portion 142b is located between the first pad portion 142a and the third pad portion 142c. The first pad portion 142a is where an end of a second conductive member 32 is bonded. The second pad portion 142b is where an end of a second conductive member 32 is bonded. The third pad portion 142c is where an end of a first conductive member 31 is bonded.

As shown in FIGS. 8-9, the second conductive layer 15 is a middle layer of the wiring layers. That is, the second conductive layer 15 is located between the first conductive layer 14 and the third conductive layer 16. The second conductive layer 15 includes a plurality of second plate-like members 151.

The second plate-like members 151 are made of a conductive material, such as Al or Cu. In this embodiment, the second plate-like members 151 are made of Al. Each second plate-like member 151 is rectangular in plan view and has a longitudinal direction extending in the x direction. Each second plate-like member 151 may have a width (short-direction dimension) of about 30 μm and a thickness (z-direction dimension) of about 0.5 μm. In plan view, the second plate-like members 151 are arranged side by side in the y direction, with an insulating layer 17 interposed between each two adjacent second plate-like members 151. That is, the second plate-like members 151 of the second conductive layer 15 are insulated from each other by the insulating layers 17.

As shown in FIGS. 8-9, the third conductive layer 16 is the innermost layer of the wiring layers. That is, the third conductive layer 16 is nearest to the substrate 11 (in particular, the substrate main surface 111) than the first conductive layer 14 and the second conductive layer 15. The third conductive layer 16 includes a plurality of third plate-like members 161.

The third plate-like members 161 are made of a conductive material, such as Al or Cu. In this embodiment, the third plate-like members 161 are made of Al. Each third plate-like member 161 is rectangular in plan view and has a longitudinal direction extending in the y direction. Each third plate-like member 161 may have a width (short-direction dimension) of about 1.0 μm and a thickness (z-direction dimension) of about 0.5 μm. In plan view, the third plate-like members 161 are arranged side by side in the x direction, with an insulating layer 17 interposed between each two adjacent third plate-like members 161. That is, the third plate-like members 161 of the third conductive layer 16 are insulated from each other by the insulating layers 17. In this embodiment, the third plate-like members 161 are arranged in the x direction at intervals of about 0.6 μm.

In the wiring layers, the number of first plate-like members 141 is smaller than the number of second plate-like members 151, which is smaller than the number of third plate-like members 161. In addition, the number of third plate-like members 161 is smaller than the number of element electrodes. That is, the wiring layers establish electrical conduction from the element electrodes such that the number of current paths is sequentially reduced from the third conductive layer 16 to the second conductive layer 15 and further to the first conductive layer 14.

In the wiring layers, as shown in FIG. 8, the first plate-like members 141 are arranged on a plane (x-y plane) perpendicular to the z direction, and so are the second and third plate-like members 151, 161. In addition, the longitudinal direction of the first plate-like members 141 is perpendicular to the longitudinal direction of the second plate-like members 151, which in turn is perpendicular to the longitudinal direction of the third plate-like members 161.

Referring to FIG. 5, the first plate-like members 141 (first conductive layer 14) include first electrode conducting members 141a electrically connected to the first electrodes 121 and second electrode conducting members 141b electrically connected to the second electrodes 122. The first and second electrode conducting members 141a, 141b are arranged alternately in the x direction. In the example shown in FIG. 5, the three first conducting members 141a on the left side are connected to the first electrodes 121 of the first semiconductor element 1A, while the four first conducting members 141a on the right side are connected to the first electrodes 121 of the first semiconductor element 1B. Likewise, the four second conducting members 141b on the left side are connected to the second electrodes 122 of the first semiconductor element 1A, while the four second conducting members 141b on the right side are connected to the second electrodes 122 of the first semiconductor element 1B.

Similarly, the second plate-like members 151 include first electrode conducting members 151a electrically connected to first electrodes 121 and second electrode conducting members 151b electrically connected to second electrodes 122. The first electrode conducting members 151a and the second electrode conducting members 151b are arranged alternately in the y direction. Similarly, the third plate-like members 161 include first electrode conducting members 161a electrically connected to first electrodes 121 and second electrode conducting members 161b electrically connected to second electrodes 122. The third plate-like members 161 additionally include third electrode conducting members 161c electrically connected to third electrodes 123. Each third electrode conducting member 161c is located between a first electrode conducting member 161a and a second electrode conducting member 161b that are adjacent to each other.

As shown in FIG. 9, the insulating layers 17 are present between the first conductive layer 14 and the semiconductor substrate 11 (substrate main surface 111). The insulating layers 17 may be any electrically insulating material, and $SiO_2$ is one example. The insulating layers 17 include a first interlayer insulating film 171, a second interlayer insulating film 172 and a third interlayer insulating film 173. The first interlayer insulating film 171 is interposed between the first conductive layer 14 and the second conductive layer 15 to insulate them. The second interlayer insulating film 172 is interposed between the second conductive layer 15 and the third conductive layer 16 to insulate them. The third interlayer insulating film 173 is interposed between the third conductive layer 16 and the semiconductor substrate 11 (substrate main surface 111) to insulate the third conductive layer 16 from the element electrodes. The insulating layers 17 have portions interposed between adjacent first plate-like members 141 of the first conductive layer 14 in the x direction, between adjacent second plate-like members 151 of the second conductive layer 15 in the y direction, and between adjacent third plate-like members 161 of the third conductive layer 16 in the x direction. In FIG. 8, those interposed portions of the insulating layers 17 are omitted.

Each of the vias 18 is composed of a through hole formed in an insulating layer 17 and a conductive material filling the through hole. In this embodiment, the conductive material is, without limitation, tungsten (W). The conductive material for the vias 18 may be aluminum or copper. In addition, each via 18 may be formed by coating the inner surface of a through hole, instead of filling the through hole. The vias 18 extend in the z direction. As shown in FIG. 8, the vias 18 of this embodiment are circular in plan view, but other shapes may be employed. For example, the vias 18 may be rectangular or polygonal in plan view. In the present embodiment, the vias 18 include first vias 181, second vias 182 and third vias 183.

As shown in FIGS. 8 and 9, the first vias 181 extend through the first interlayer insulating film 171 and thus located between the first conductive layer 14 and the second conductive layer 15. The first vias 181 provide electrical communication between the first conductive layer 14 and the second conductive layer 15. The arrangement of the first vias 181 is not specifically limited and may be determined appropriately in view of the arrangements of the first plate-like members 141 of the first conductive layer 14 and the second plate-like members 151 of the second conductive layer 15.

As shown in FIGS. 8 and 9, the second vias 182 extend through the second interlayer insulating film 172 and thus located between the second conductive layer 15 and the third conductive layer 16. The second vias 182 provide electrical communication between the second conductive layer 15 and the third conductive layer 16. The arrangement of the second vias 182 is not specifically limited and may be determined appropriately in view of the arrangements of the second plate-like members 151 of the second conductive layer 15 and the third plate-like members 161 of the third conductive layer 16.

As shown in FIGS. 8 and 9, the third vias 183 extend through the third interlayer insulating film 173 such that each via 183 is located between the third conductive layer 16 and an element electrode 12. The third vias 183 electrically connect the third conductive layer 16 and the element electrodes. The arrangement of the third vias 183 is not limited and may be determined appropriately in view of the arrangements of the third plate-like members 161 of the third conductive layer 16 and the element electrodes.

The protective layer 19 covers the upper surface of the wiring layers (the first conductive layer 14) as shown in FIG. 9. The protective layer 19 may be formed by depositing $Si_3N_4$ or $SiO_2$ by plasma CVD or by applying polyimide resin. Alternatively, the protective layer 19 may be formed by a combination of the above-mentioned techniques. In this embodiment, the protective layer 19 has openings through which the first pad portions 142a, the second pad portions 142b and the third pad portions 142c are exposed.

The second semiconductor element 2 has an element main surface 21 and an element rear surface 22 opposite to each other in the z direction. The element main surface 21 faces in the same direction as the substrate main surface 111 of the semiconductor substrate 11. Similarly, the element rear surface 22 faces in the same direction as the substrate rear surface 112 of the semiconductor substrate 11. As shown in FIG. 5, the second semiconductor element 2 has a plurality of pad portions 211 on the element main surface 21. Each pad portion 211 is where a third conductive members 33 is bonded.

Each first conductive member 31 electrically connects one of the first semiconductor elements 1 to the lead frame 4. Hence, each first conductive member 31 extends beyond (in other words, crosses) the outer edge of the corresponding first semiconductor element 1 in plan view. Each first conductive member 31 has a connecting portion 311 bonded to a third pad portion 142c of the corresponding first semiconductor element 1 and a connecting portion 312 bonded to the lead frame 4 (at a bonding pad portion 42, which will be described later). The first conductive members 31 may be formed by using a wedge tool that performs wedge bonding to form the connecting portions 311 and 312. The length (the size in the longitudinal direction) of the connecting portions 311 and 312 depends on the wedge tool.

The entirety of each second conductive member 32 overlaps with one of the first semiconductor elements 1 in plan view. Hence, each second conductive member 32 does not cross the outer edge of either of the first semiconductor elements 1 in plan view. The second conductive members 32 extend substantially linearly in the longitudinal direction of the respective first plate-like members 141. In the embodiment shown in FIG. 4, the length (longitudinal-dimension) of the second conductive members 32 in plan view is, without limitation, about half that of the first plate-like members 141. For example, the second conductive members 32 may be longer than the half-length of the first plate-like members 141 in plan view. Each second conductive member 32 has a connecting portion 321 and a connecting portion 322 respectively bonded to a first pad portion 142a and a second par portion 142b of a corresponding first semiconductor element 1 (see FIG. 7). The second conductive members 32 may be formed by using a wedge tool that performs wedge bonding to form the connecting portions 321 and 322. The length of the connecting portions 321 and 312 depends on the wedge tool.

As shown in FIGS. 4, 5 and 7, each second conductive member 32 has two ends 32a spaced apart in the longitudinal direction thereof. One of the two ends 32a is disposed on the first pad portion 142a, and the other on the second pad portion 142b. In this embodiment, as shown in FIG. 7, each end 32a is a part of a corresponding one of the connecting portions 321 and 322.

The third conductive members 33 electrically connect the second semiconductor element 2 to the lead frame 4. The third conductive members 33 extend beyond the outer edge of the second semiconductor element 2 in plan view. Each third conductive member 33 has a connecting portion 331 bonded to a pad portion 211 of the second semiconductor element 2 and a connecting portion 332 bonded to the lead frame 4 (a bonding pad portion 42, which will be described later). The third conductive members 33 may be formed by using a wedge tool that performs wedge bonding, whereby the connecting portions 331 and 332 are formed. The length of the connecting portions 331 and 332 depends on the wedge tool.

In this embodiment, the first conductive members 31, the second conductive members 32 and the third conductive members are bonding wires having a circular cross section. Alternatively, ribbon wires having a rectangular cross section may be used. The main component of such wires is Al, for example, though the present disclosure is not limited to this. Instead of Al, the conductive members 31, 32 and 33 may be made of Cu or Au. When use is made of wires of a circular cross section, the conductive members 31-33 may have a diameter of about 75 μm, for example.

The lead frame 4 provides conduction paths from the first semiconductor elements 1 and the second semiconductor element 2 to a circuit board on which the semiconductor device A1 is mounted. The lead frame 4 supports and electrically connects to the first semiconductor elements 1 and the second semiconductor element 2. The lead frame 4 may be formed from a thin and rectangular sheet of metal, such as Cu, using suitable processing, including punching, cutting and bending. The lead frame 4 has a die pad portion 41, and bonding pad portions 42a, 42b, 42c and 42d, lead portions 43a, 43b, 43c and 43d, and side extensions 44. For convenience, the bonding pad portions 42a to 42d may be collectively referred to as bonding pad portions 42 when no distinction is necessary. Similarly, the lead portions 43a to 43d may be collectively referred to as lead portions 43.

The die pad portion 41 is where the first semiconductor elements and the second semiconductor element 2 are mounted. The first semiconductor elements 1 and the second semiconductor element 2 are bonded to the die pad portion 41 by a bonding material 411. The bonding material 411 may be, but not limited to, solder paste or Ag paste.

Each bonding pad portion 42 is where a first conductive member 31, a second conductive member 32 or a third conductive member 33 is bonded. The bonding pad portions 42 are spaced apart from each other. In addition, the bonding pad portions 42 of this embodiment are spaced apart from the die pad portion 41. Alternatively, one of the bonding pad portions 42 may be formed integral with the die pad portion 41. In such an alternative, the lead frame 4 may be without the side extensions 44. In the illustrated example, each bonding pad portion 42 is rectangular in plan view.

Specifically, the bonding pad portion 42a is electrically connected via some of the first conductive members 31 to the second electrodes 122 of the first semiconductor element 1A. The bonding pad portion 42a is continuous with three lead portions 43a.

The bonding pad portion 42b is electrically connected via some of the first conductive members 31 to the second electrodes 122 of the first semiconductor element 1B. The bonding pad portion 42b is continuous with three lead portions 43b.

The bonding pad portion 42c is electrically connected via some of the first conductive members 31 to the first electrodes 121 of both of the first semiconductor elements 1A and 1B. The bonding pad portion 42c is continuous with five lead portions 43c.

Each bonding pad portion 42d is electrically connected via a third conductive member 33 to the second semiconductor element 2. Each bonding pad portion 42d is continuous with one lead portion 43d.

As shown in FIG. 4, each of the lead portions 43a to 43d is an integral extension of a corresponding one of the bonding pad portions 42a to 42d. Each lead portion 43 has a part exposed from the sealing resin 5 so as to serve as a terminal used when the semiconductor device A1 is mounted on a circuit board. Plating may be applied to the exposed part of each lead portion 43. The exposed part of the lead portion 43 may have a bend. In this embodiment, eight lead portions 43 extend outward beyond the opposite sides of the sealing resin 5 in the y direction, though the number and the arrangement of the lead portions 43 are not limited to those shown in FIGS. 1 and 4.

The lead portions 43a are continuous with the bonding pad portions 42a. As noted above, the bonding pad portions 42a are electrically connected to the second electrodes 122 (source electrodes) of the first semiconductor element 1A. Thus, the lead portions 43a are source electrodes of the first semiconductor element 1A.

The lead portions 43b are continuous with the bonding pad portions 42b. As noted above, the bonding pad portions 42b are electrically connected to the second electrodes 122 (source electrodes) of the first semiconductor element 1B. Thus, the lead portions 43b are source electrodes of the first semiconductor element 1B.

The lead portions 43c are continuous with the bonding pad portions 42c. As noted above, the bonding pad portions 42c are electrically connected to the first electrodes 121 (drain electrodes) of the first semiconductor elements 1A, 1B. Thus, the lead portions 43c are drain electrodes of the first semiconductor elements. In this embodiment, the first semiconductor elements 1A and 1B have common drain terminals by the bonding pad portion 42c and the lead portions 43C. Alternatively, the first semiconductor elements 1A and 1B may have different sets of drain terminals, respectively.

The lead portions 43d are continuous with the respective bonding pad portions 42d, which are electrically connected to the second semiconductor element 2. In other words, the lead portions 43d are connected to the second semiconductor element 2 to function as various types of terminals, including a power grid terminal, a device control terminal, a power supply input terminal for the analog circuitry, a feedback terminal, a soft start time setting terminal, a terminal for spread spectrum setting, a mode switching terminal, a terminal for internal constant voltage control, and an ERRAMP output terminal. However, these are only examples, and the lead portions 43d may be electrically connected to the second semiconductor element 2 to function as other terminals than the examples listed above. Although not shown in FIGS. 4 and 5, the third electrodes 123 of the first semiconductor elements 1 are electrically connected to the second semiconductor element 2.

Each side extension 44 extends from one of the opposite edges of the die pad portion 41 in the x direction. That is, one end of the side extension 44 is continuous with the die pad portion 41 and the opposite end in the x direction is exposed from the sealing resin 5. In this embodiment, two side extensions 44 extend each from an opposite edge of the die pad portion 41 in the x direction. In addition, each side extension 44 is aligned with one of the opposite edges of the die pad portion 41 in the y direction.

As shown in FIGS. 1 to 7, the sealing resin 5 covers the first semiconductor elements 1, the second semiconductor element 2, the first conductive members 31, the second conductive members 32 and the third conductive members 33, in addition to a part of the lead frame 4. The sealing resin 5 is made of an insulating material, which, in this embodiment, is a black epoxy resin, for example. The sealing resin 5 is rectangular in plan view.

The following describes advantages of the semiconductor device A1 according to the first embodiment.

The semiconductor device A1 has the wiring layers disposed over the first semiconductor elements 1, and the wiring layers have the first pad portions 142a and the second pad portions 142b. In addition, use is made of second conductive members 32 each having a connecting portion 321 and a connecting portion 322 that are bonded to a first pad portion 142a and a second pad portion 142b, respectively. By providing such conductive members 32, a current path is additionally formed between the first pad portion 142a and the second pad portion 142b, i.e., through the second conductive member 32. That is, the second conductive members 32 can provide bypass paths for the electric current to flow, instead of through the wiring layers. This contributes to reducing the overall wiring resistance of the wiring layers, and consequently to reducing the internal resistance of the semiconductor device A1.

In accordance with the semiconductor device A1, the wiring layers include the first conductive layer 14 made up of first plate-like members 141, each of which has a first pad portion 142a and a second pad portion 142b. With this configuration, the first pad portion 142a and the second pad portion 142b of each first plate-like member 141 are electrically connected twofold, i.e., by one path through the first plate-like member 141 and by the other path through the second conductive member 32. The second conductive members 32 each have a smaller resistance than the first plate-like members 141. This helps to reduce the wiring resistance of the first plate-like members 141, and consequently to reduce the internal resistance of the semiconductor device A1. For instance, it is supposed that the wiring resistance of each first plate-like member 141 is 11 mΩ, and a total of ten first plate-like members 141 are used for the first conductive layer 14. Then, the first conductive layer 14 will have a wiring resistance of 110 mΩ (=11 mΩ×10). Further, it is supposed that the wiring resistance of a second conductive member 32 is 2 mΩ, and the second conductive member 32 connects the first pad portion 142a and the second pad portion 142b of each first plate-like member 141 to provide a bypass current path. In this manner, the resistances of 110 mΩ and 2 mΩ are connected in parallel, thereby providing an advantageously low, combined resistance of 1.96 mΩ for the semiconductor device A1. It should be noted that a longer second conductive member 32 (with all the other conditions unchanged) can provide an additional lower-resistance current bypath, which contributes to further reducing the total wiring resistance.

The semiconductor device A1 has the wiring layers, which include three conductive layers (the first conductive layer 14, the second conductive layer 15 and the third conductive layer 16) through which the current paths connected from the element electrodes are merged to fewer current paths. The wiring layers may have more than three conductive layers, this configuration will unduly increase the lengths of the current paths from the element electrodes to the first conductive layer 14 (surface layer). It is therefore preferable that the wiring layers may include up to three conductive layers (14, 15 and 16), as arranged with the semiconductor device A1, in which the lengths of the relevant current paths can be relatively short. In this manner, the resistance of the wiring layers and hence the internal resistance of the semiconductor device A1 can be set to a desired low value.

In the semiconductor device A1, the first conductive members 31, the second conductive members 32 and the third conductive members 33 are all formed by using bonding wires of the same diameter. This configuration allows the same bonding tool (wedge tool) to be used for wedge bonding of the first conductive members 31, the second conductive members 32 and the third conductive members 33. In other words, it is not necessary to prepare a plurality of bonding tools for bonding wires of different diameters. This allows the semiconductor device A1 to be manufactured more efficiently.

According to the semiconductor device A1, the bonding pad portion 42a where a plurality of first conductive members 31 are bonded is integral with a plurality of lead portions 43a. Further, the bonding pad portion 42b where a plurality of first conductive members 31 are bonded is integral with a plurality of lead portions 43b. Still further, the pad portion 42c where a plurality of first conductive members 31 are bonded is integral with a plurality of lead portions 43c. In this embodiment, the lead portions 43a act as the source terminals of the first semiconductor element 1A, the lead portions 43b as the source terminals of the first semiconductor element 1B, and the lead portions 43c as the common drain terminals of the first semiconductor elements 1A and 1B. This configuration enables the semiconductor device A1 to pass a relatively large drain-source current to each first semiconductor element 1.

FIGS. 10 to 21 show semiconductor devices according to other embodiments of the present disclosure. In these figures, like elements are denoted by the same reference signs used for the corresponding elements in the first embodiment.

Figure 10:
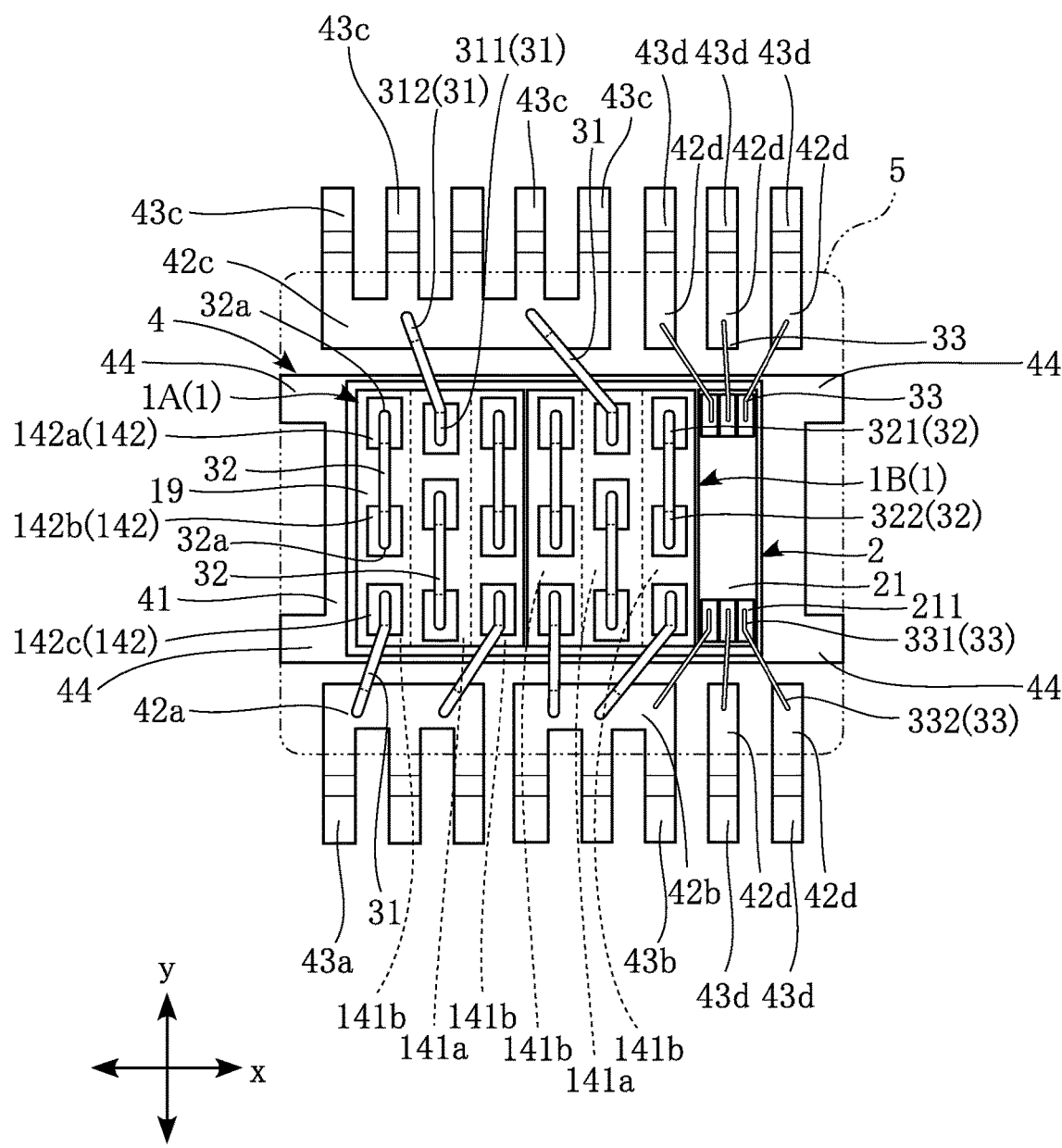
FIG. 10 is a plan view of a semiconductor device (omitting a sealing resin) according to a second embodiment.

FIG. 10 is a plan view of a semiconductor device A2 according to a second embodiment. FIG. 10 corresponds to FIG. 4 showing the semiconductor device A1 of the first embodiment. The semiconductor device A2 differs from semiconductor device A1 mainly in the wire diameter of the first conductive members 31 and of the second conductive members 32.

The first conductive members 31 and the second conductive members 32 have the same wire diameter, which is about 125 μm. In other words, the first conductive members 31 and the second conductive members 32 of this embodiment have larger wire diameter than the first conductive members 31 and the second conductive members 32 of the semiconductor device A1. Note that the third conductive members 33 of this embodiment has a wire diameter of about 75 μm, which is the same as the wire diameter of the third conductive members 33 of the semiconductor device A1.

In this embodiment, the first plate-like members 141 of the first conductive layer 14 have a width of about 400 μm, which is greater than the width of the first plate-like members 141 of the semiconductor device A1. In addition, the first conductive layer 14 of this embodiment includes six first plate-like members 141 as shown in FIG. 10. That is, the semiconductor device A2 of this embodiment has a smaller number of first plate-like members 141 than the semiconductor device A1. In this embodiment, the six first plate-like members 141 include one first electrode conducting member 141a and two second electrode conducting members 141b for each first semiconductor element 1.

The semiconductor device A2 has the following configuration similar to the semiconductor device A1. That is, the wiring layers disposed over the first semiconductor elements 1 have the first pad portions 142a and the second pad portions 142b. In addition, each second conductive member 32 has a connecting portion 321 bonded to a first pad portion 142a and a connecting portion 322 bonded to a second pad portion 142b. Thus, a current path is formed between the first pad portion 142a and the second pad portion 142b through the second conductive member 32. That is, the second conductive members 32 can provide bypass paths for the electric current flow, instead of through the wiring layers. This helps to reduce the wiring resistance of the wiring layers, and consequently to reduce the internal resistance of the semiconductor device A2.

The semiconductor device A2 has the wiring layers similar to the wiring layers of the semiconductor device A1. Specifically, the wiring layers include the first conductive layer 14 that includes first plate-like members 141. Each first plate-like member 141 has a first pad portion 142a and a second pad portion 142b. The semiconductor device A2 can therefore achieve the same advantage as the semiconductor device A1: the wiring resistance of the first plate-like members 141 is reduced, and consequently the internal resistance of the semiconductor device A2 is reduced.

The semiconductor device A2 has a smaller number of first conductive members 31 and a smaller number of second conductive members 32 than in the semiconductor device A1. This means that the semiconductor device A2 requires less time and labor than the semiconductor device A1, to check the first conductive members and the second conductive member 32 for any possible bonding failure.

The first plate-like members 141 of the semiconductor device A2 is wider than those in the semiconductor device A1. This allows each first plate-like member 141 to have wider pad portions 142 than those in the semiconductor device A1. Consequently, larger diameter wires can be used for the first conductive members 31 and the second conductive members 32 of the semiconductor device A2 than those used in the semiconductor device A1. The first conductive members 31 and the second conductive members 32 having a larger wire diameter are preferable to further reduce the wiring resistance. Note, however, that the wider first plate-like members 141 tend to increase the size of the first semiconductor elements 1 in plan view. When a smaller first semiconductor element 1 is preferred, the first plate-like members 141 having a relatively narrow width should be used as in the semiconductor device A1.

The first conductive members 31 and the second conductive members 32 of the semiconductor device A2 have a larger wire diameter than those in the semiconductor device A1. That is, the semiconductor device A2 has thicker first conductive members 31 and thicker second conductive members 32 than the semiconductor device A1. This configuration ensures that the semiconductor device A2 is less susceptible to cracking at the neck portions of the first conductive members 31 and the second conductive members 32 than the semiconductor device A1.

Figure 11:
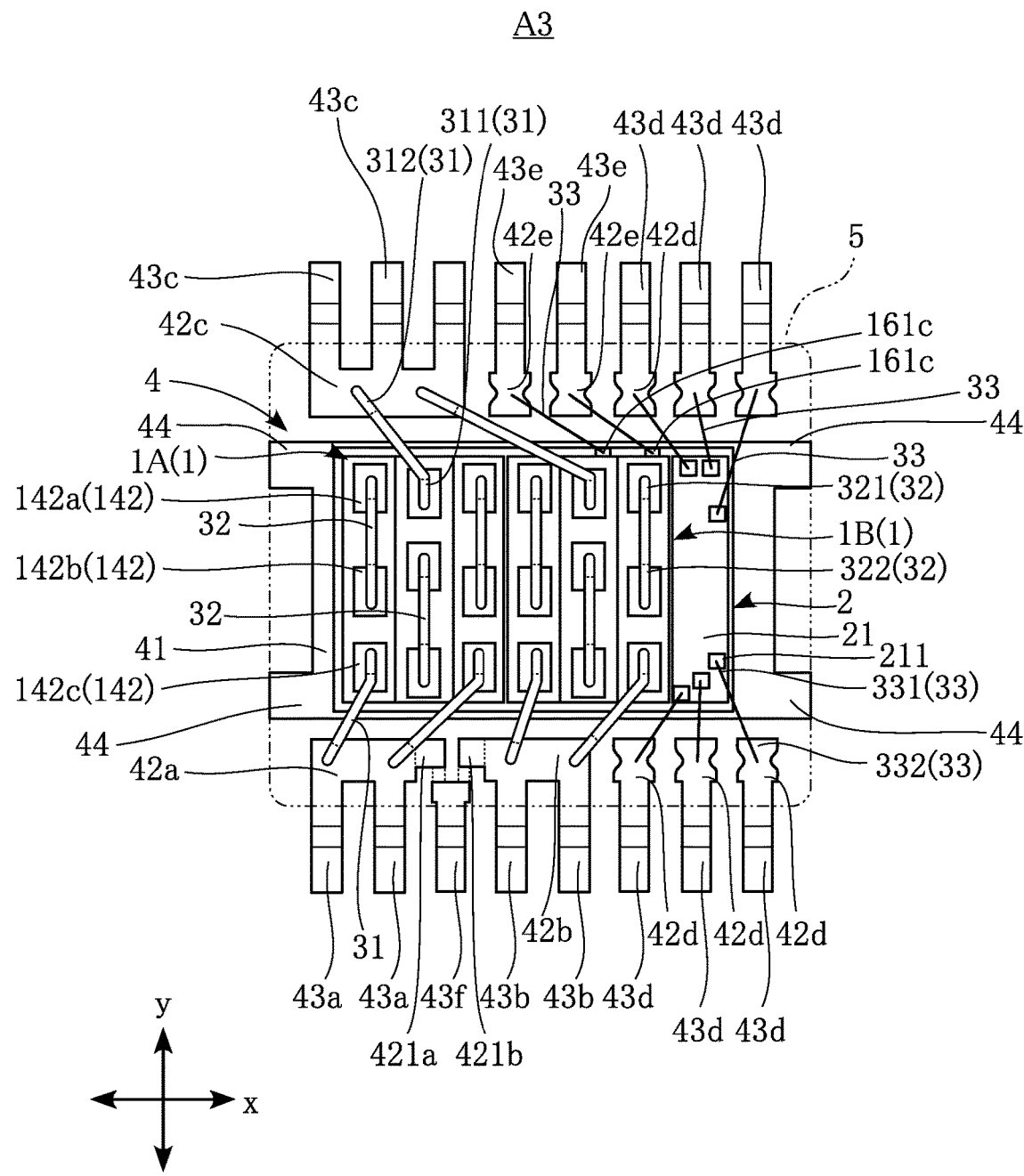
FIG. 11 is a plan view of a semiconductor device (omitting a sealing resin) according to a third embodiment.

FIG. 11 is a plan view of a semiconductor device A3 according to a third embodiment. FIG. 11 corresponds to FIG. 4 showing the semiconductor device A1 of the first embodiment. The semiconductor device A3 differs from the semiconductor device A2 mainly in the shape of the lead frame 4.

The lead frame 4 of this embodiment includes a die pad portion 41, bonding pad portions 42a, 42b, 42c, 42d and 42e, lead portions 43a, 43b, 43c, 43d, 43e and 43f, and side extensions 44. As compared with the lead frame 4 of the semiconductor device A2, the lead frame 4 of this embodiment additionally includes the bonding pad portions 42e, the lead portions 43e and the lead portion 43f.

In this embodiment, each of the bonding pad portions 42d and 42e has a recess in each side in the x direction. More specifically, as shown in FIG. 11, the sides of each of the bonding pad portions 42d and 42e in the x direction are recessed toward each other at a middle in the y direction. Thus, each of the bonding pad portions 42d and 42e is narrower at a middle in the y direction than at the ends in the y direction. The bonding pad portions 42d and 42e all have the same size. Each bonding pad portion 42d is electrically connected to the second semiconductor element 2 via a third conductive member 33. Each bonding pad portion 42e is electrically connected to third electrodes 123 of a corresponding first semiconductor element 1 via a third conductive member 33.

The lead portion 43f is not connected to any of the bonding pad portions 42a to 42e and thus not electrically connected to any of the first semiconductor elements 1 and the second semiconductor element 2. As shown in FIG. 11, the lead portion 43f is located between a lead portion 43a and a lead portion 43b. In this embodiment, with respect to the lead portion 43f, two lead portion 43a are located on one side, and the two lead portion 43b are located on the opposite side in the x direction. The lead portion 43f shown in FIG. 11 is wider at a portion covered by the sealing resin 5 than at a portion not covered by the sealing resin 5. However, this is just an example, and the uncovered portion of the lead portion 43f may have the same width or a smaller width relative to the covered portion. Yet, it is preferable to have a wider covered portion as shown in FIG. 11, for preventing unintentional detachment of the lead portion 43f from the sealing resin 5.

Unlike the first embodiment, the bonding pad portions 42a and 42b of this embodiment are not rectangular. The bonding pad portions 42a and 42b respectively have a protrusions 421a and 421b. Each of the protrusions 421a and 421b extends from one side of the bonding pad portion in the x direction. Each of the protrusions 421a and 421b overlaps with the lead portion 43f as viewed in the y direction.

The lead frame 4 of this embodiment includes one bonding pad portion 42a continuous with two lead portions 43a. The lead frame 4 also includes one bonding pad portion 42b continuous with two lead portions 43b. The lead frame 4 also includes one bonding pad portion 42c continuous with three lead portions 43c. The lead frame 4 also includes six bonding pad portions 42d each of which is continuous with one lead portion 43d. The lead frame 4 also includes two bonding pad portions 42e each of which is continuous with one lead portion 43e. The lead frame 4 also includes one lead portion 43f.

In this embodiment, the third conductive members 33 are made with gold (Au) wire or Cu wire. The third conductive members 33 may be formed by ball bonding or stitch bonding performed with a capillary. The details of the third conductive members 33, such as materials, forming methods and configurations, are not limited to those described above. For example, the third conductive members 33 of this embodiment may be Al wire, rather than Au or Cu wire. In addition, the third conductive members 33 of this embodiment may have a wire diameter of about 75 μm as in the first and second embodiments.

The semiconductor device A3 has the following configuration similar to the semiconductor device A1. That is, the wiring layers formed over the first semiconductor elements 1 include first pad portions 142a and second pad portions 142b. In addition, each second conductive member 32 has a connecting portion 321 and a connecting portion 322 respectively bonded to a first pad portion 142a and a second pad portion 142b. With this configuration, a current path is formed between the first pad portion 142a and the second pad portion 142b through the second conductive member 32. That is, the second conductive members 32 can provide bypass paths for the electric current to flow, instead of through the wiring layers. This helps to reduce the wiring resistance of the wiring layers, and consequently to reduce the internal resistance of the semiconductor device A3.

The semiconductor device A3 has the wiring layers similar to the wiring layers of the semiconductor device A1. Specifically, the wiring layers include the first conductive layer 14 that includes first plate-like members 141. Each first plate-like member 141 has a first pad portion 142a and a second pad portion 142b. Thus, the semiconductor device A3 can achieve the same advantage as the semiconductor device A1: the wiring resistance of the first plate-like members 141 is reduced, and consequently the internal resistance of the semiconductor device A3 is reduced.

The semiconductor device A3 additionally includes the lead portion 43f not connected to any of the bonding pad portions 42a to 42e. With respect to this lead portion 43f, the two lead portions 43a, which are connected to the second electrodes 122 of the first semiconductor element 1A, are located on one side, whereas the two lead portions 43b, which are connected to the second electrodes 122 of the first semiconductor element 1B, are located on the opposite side in the x direction. Thus, a longer distance is secured between adjacent lead portions 43a and 43b, which is effective to prevent a short circuit between second electrodes 122 of the different first semiconductor elements 1.

According to the semiconductor device A3, the bonding pad portions 42a and 42b respectively have protrusions 421a and 421b, so that the area of each of the bonding pad portions 42a and 42b in plan view is increased. This is advantageous in, for example, wire bonding of the first conductive members 31, the second conductive members 32 and the third conductive members 33. In a bonding process, the lead frame 4 may need to be fixed immovable by holding a region of the bonding pad 42 with a fixture, such as a clip, of a wire bonding apparatus. With the lead frame 4 having a larger area, it is easier to find a region available for holding with such a fixture, facilitating the fixing of the lead frame 4. In addition, the lead frame 4 having a larger area will have a sufficient area left available for bonding a plurality of first conductive members 31, even when it is held with such a fixture. This facilitates bonding of the first conductive members 31 as shown in FIG. 11.

Figure 12:
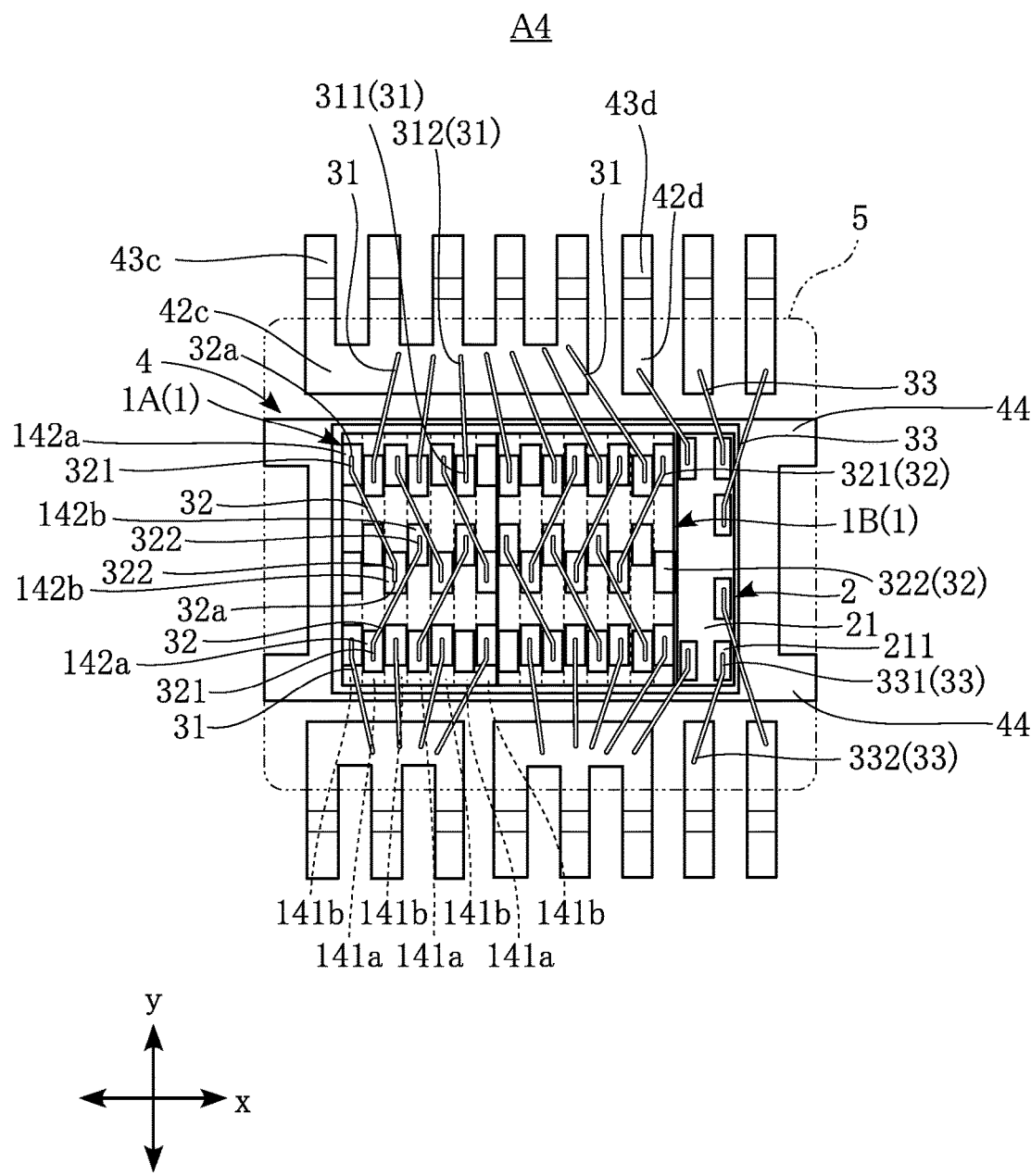
FIG. 12 is a plan view of a semiconductor device (omitting a sealing resin) according to a fourth embodiment.

FIG. 12 is a plan view of a semiconductor device A4 according to a fourth embodiment. FIG. 12 corresponds to FIG. 4 showing the semiconductor device A1 of the first embodiment. The semiconductor device A4 differs from the semiconductor device A1 mainly in the connection configuration of the second conductive members 32.

Each second conductive member 32 of this embodiment has a bend in plan view. Some of the second conductive members 32 are connected from one first electrode conducting member 141a to another first electrode conducting member 141a adjacent in the x direction within the same first semiconductor element 1. More specifically, the connecting portion 321 of such a second conductive member 32 is bonded to the first pad portion 142a of the one of the two first electrode conducting members 141a, whereas the connecting portion 322 of that second conductive member 32 is bonded to the second pad portion 142b of the other first electrode conducting member 141a. In addition, some of the second conductive members 32 are connected from one second electrode conducting member 141b to another second electrode conducting member 141b adjacent in the x direction within the same first semiconductor element 1. More specifically, the connecting portion 321 of such a second conductive member 32 is bonded to the first pad portion 142a of the one of the two second electrode conducting members 141b, whereas the connecting portion 322 of that second conductive member 32 is bonded to the second pad portion 142b of the other second electrode conducting member 141b.

The semiconductor device A4 has the following configuration similar to the semiconductor device A1. That is, the wiring layers formed over the first semiconductor elements 1 include first pad portions 142a and second pad portions 142b. In addition, each second conductive member 32 has a connecting portion 321 bonded to a first pad portion 142a and a connecting portion 322 bonded to a second pad portion 142b. Thus, a current path is formed between the first pad portion 142a and the second pad portion 142b through the second conductive member 32. That is, the second conductive members 32 can provide bypass paths for the electric current to flow, instead of through the wiring layers. This helps to reduce the wiring resistance of the wiring layers, and consequently to reduce the internal resistance of the semiconductor device A4.

In the semiconductor device A4, as shown in FIG. 12, the first conductive layers 14 of the respective first semiconductor elements 1 have similar configurations to those in the first embodiment. However, this does not limit the present disclosure. For instance, it is possible to apply the same connection configuration of the second conductive member 32s shown in FIG. 12 to the first conductive layers 14 of the second or third embodiment. Specifically, in the semiconductor device A2 shown in FIG. 10, a second conductive member 32 may extend to bridge between two second electrode conducting members 141b that are adjacent in the x direction, with being connected at one end to one of the second electrode conducting members 141b and at the other end to the other of the second electrode conducting members 141b.

Referring back to the semiconductor device A4 shown in FIG. 12, each first semiconductor element 1 (the first plate-like members 141) include first pad portions 142a and second pad portions 142b to which no second conductive member 32 is bonded. In an alternative configuration, such first pad portions 142a and second pad portions 142b may be omitted. This alternative configuration is preferable to reduce occurrence of unintentional short circuit between the pad portions 142 not bonded to any second conductive member 32.

Figure 13:
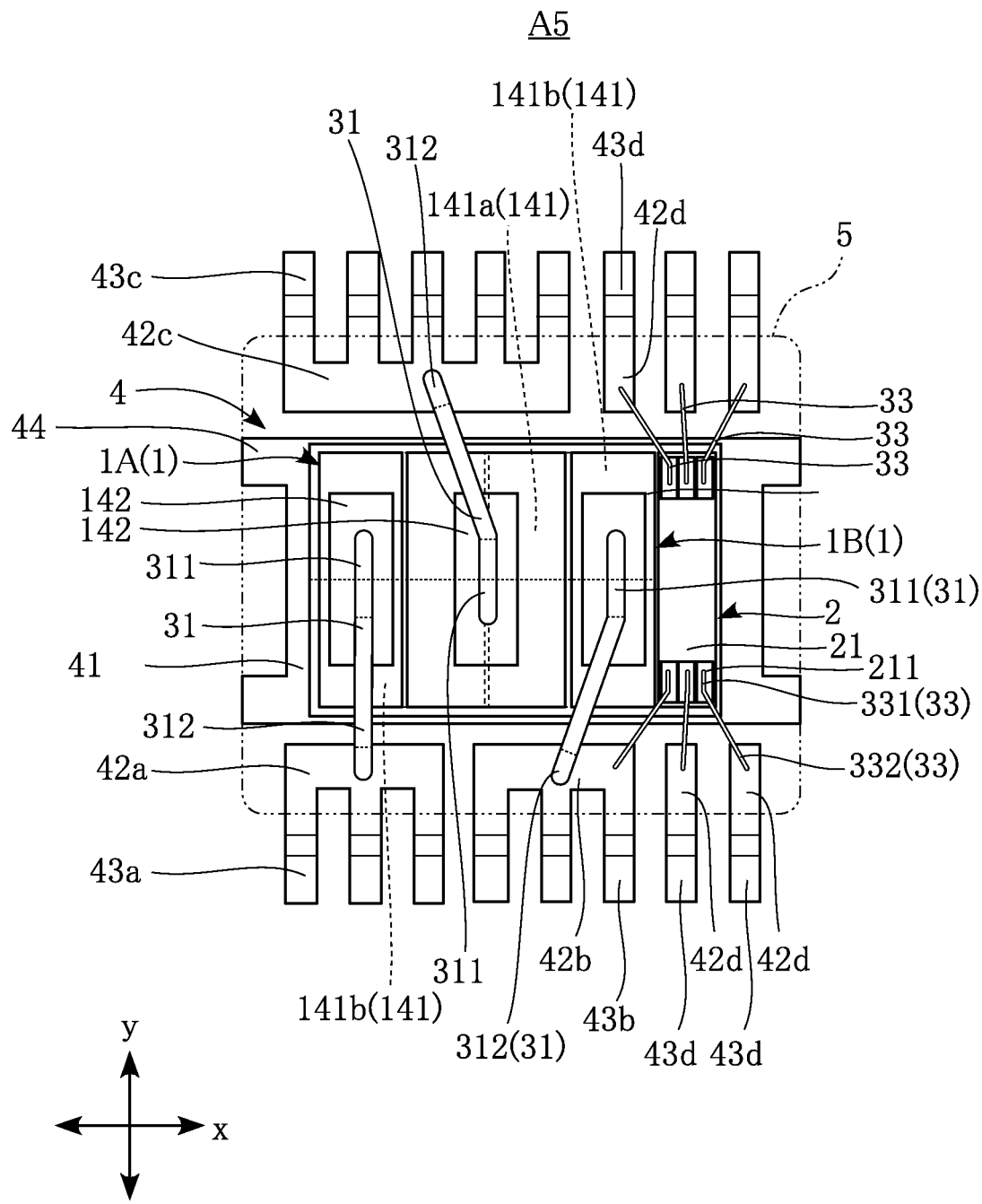
FIG. 13 is a plan view of a semiconductor device (omitting a sealing resin) according to a fifth embodiment.

FIG. 13 is a plan view of a semiconductor device A5 according to a fifth embodiment. FIG. 13 corresponds to FIG. 4 showing the semiconductor device A1 of the first embodiment. The semiconductor device A5 differs from the semiconductor device A1 mainly in that the first conductive members 31 are thicker and that no second conductive members 32 are provided.

The first conductive layer 14 of this embodiment includes a second electrode conducting member 141b electrically connected to the second electrodes 122 of the first semiconductor element 1A, another second electrode conducting member 141b electrically connected to the second electrodes 122 of the first semiconductor element 1B, and one first electrode conducting member 141a connected to the first electrodes 121 of both the first semiconductor elements 1A and 1B. In other words, the first electrode conducting member 141a is common to both the first semiconductor elements 1A and 1B and connected to the first electrodes 121 of the first semiconductor elements 1A and 1B.

In this embodiment, the first plate-like members 141 of the first conductive layer 14 have a width of about 650 μm, which is wider than the first plate-like members 141 of the first to fourth embodiments. In addition, each first plate-like member 141 has one pad portion 142.

The first conductive members 31 of this embodiment has a thickness (wider diameter) of about 300 μm. That is, the first conductive members 31 of this embodiment are thicker than the first conductive members 31 of any of the semiconductor devices A1 to A4. The third conductive members 33 of this embodiment have a wider diameter of about 75 μm, which is the same as the wire diameter of the third conductive members 33 of the first embodiment.

As shown in FIG. 13, each first conductive member 31 of this embodiment has a connecting portion 311 bonded to a corresponding pad portion 142. In plan view, each connecting portion 311 overlaps with the center of the first semiconductor elements 1 in the y direction. In addition, the connecting portion 311 bonded to the first electrode conducting member 141a (which is electrically connected to the first electrodes 121 of both the first semiconductor elements 1A and 1B) overlaps with and extends along the boundary between the two first semiconductor elements 1A and 1B in plan view. In this embodiment, each first conductive member 31 is first bonded to the pad portion 142 of a corresponding first plate-like member 141 by wedge bonding, and then to a corresponding bonding pad portion 42 by wedge bonding.

According to the semiconductor device A5, the wiring layers formed over the first semiconductor elements 1 include pad portions 142. Each first conductive member 31 has a connecting portion 311 bonded to a corresponding pad portion 142. With this configuration, each pad portion 142 is provided with a current path through the connecting portion 311 of a first conductive member 31. That is, the connecting portions 311 of the first conductive members 31 can provide bypass paths for the electric current to flow. This helps to reduce the wiring resistance of the wiring layers, and consequently to reduce the internal resistance of the semiconductor device A5.

According to the semiconductor device A5, the first conductive layer 14 of the wiring layers includes the first plate-like members 141, and each first plate-like member 141 has a pad portion 142. With this configuration, each pad portion 142 is provided with two current paths, one through the first plate-like member 141, and the other through the connecting portion 311 of the first conductive member 31. The first conductive members 31 have a smaller wiring resistance than the first plate-like members 141. Thus, the connecting portion 311 of each first conductive member 31 can provide a bypass pass for the current to flow, instead of through the pad portion 142. In this way, the wiring resistance of the first plate-like members 141 is reduced, and consequently the internal resistance of the semiconductor device A5 is reduced.

According to the semiconductor device A5, the connecting portion 311 of each first conductive member 31 overlaps, in plan view, with the center of the corresponding first plate-like member 141 in the y direction. With this configuration, the maximum distance from the outer edge of the first plate-like member 141 to the connecting portion 311 is reduced, as compared with a connecting portion 311 located near a y-direction edge of the first plate-like member 141. In this way, the current path to each first plate-like member 141 is shortened, and consequently the internal resistance of the semiconductor device A5 is reduced.

Figure 14:
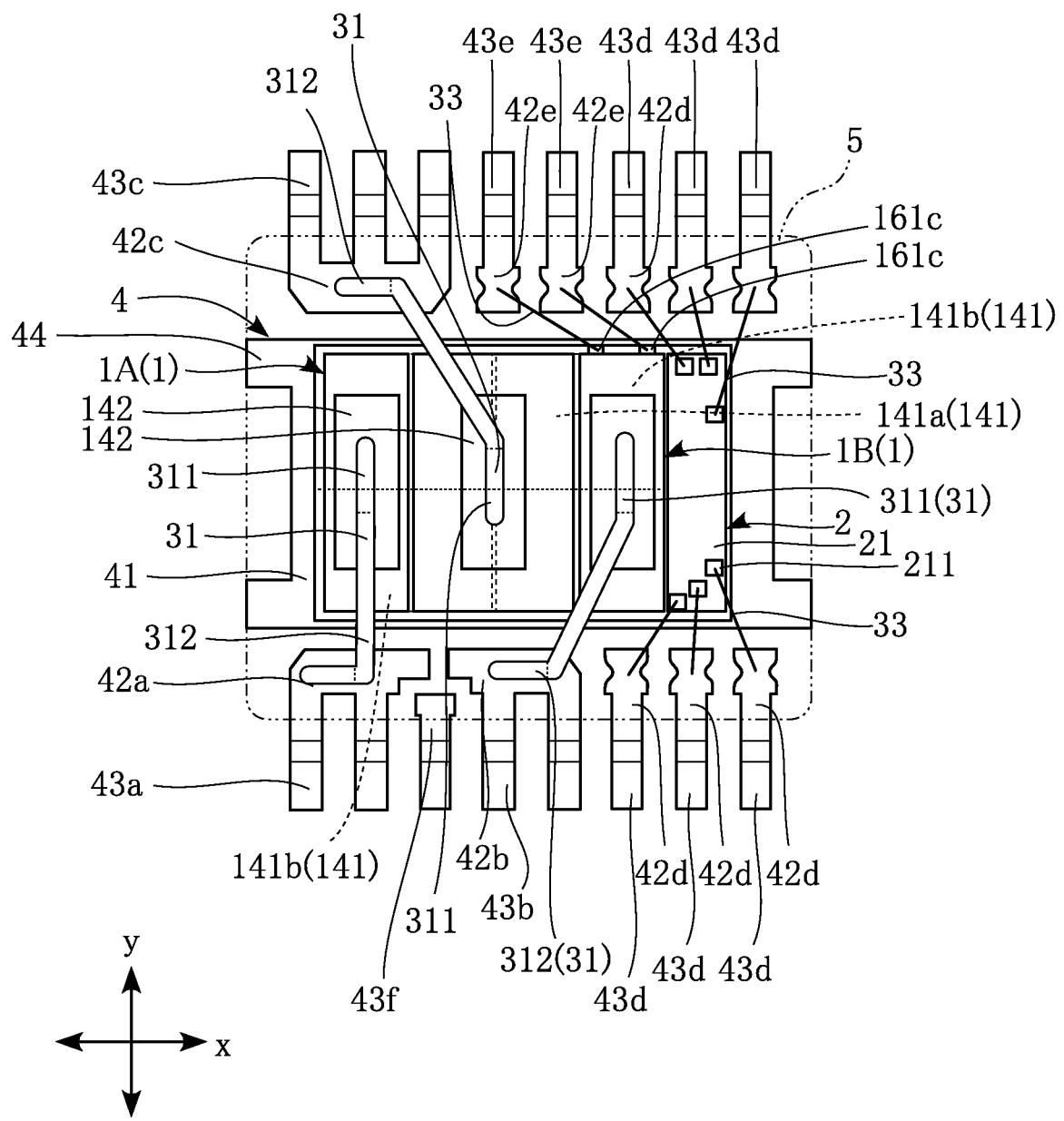
FIG. 14 is a plan view of a semiconductor device (omitting a sealing resin) according to a sixth embodiment.

FIG. 14 is a plan view of a semiconductor device A6 according to a sixth embodiment. FIG. 14 corresponds to FIG. 4 showing the semiconductor device A1 of the first embodiment. The semiconductor device A6 differs from the semiconductor device A5 mainly in the shape of the lead frame 4.

As shown in FIG. 14, the lead frame 4 of this embodiment is similar to the lead frame 4 of the third embodiment, except that each of the bonding pad portions 42a, 42b and 42c of this embodiment has at least one corner that is chamfered.

Each first conductive member 31 of this embodiment is first bonded to a corresponding bonding pad portion 42 by wedge bonding, and then to the pad portion 142 of a corresponding first plate-like member 141 by wedge bonding.

The third conductive members 33 of this embodiment are made with Au wire or Cu wire, similarly to the semiconductor device A3. Alternatively, the third conductive members 33 may be Al wire having a diameter of about 75 μm, similarly to the semiconductor device A5.

The semiconductor device A6 has the following configuration, which is similar to the semiconductor device A5. That is, the wiring layers formed over the first semiconductor elements 1 include pad portions 142. In addition, each first conductive member 31 has a connecting portion 311 bonded to a corresponding pad portion 142. With this configuration, each pad portion 142 is provided with a current path through the connecting portion 311 of a first conductive member 31. That is, the connecting portions 311 of the first conductive members 31 can provide bypass paths for the electric current to flow, instead of through the wiring layers. This helps to reduce the wiring resistance of the wiring layers, and consequently to reduce the internal resistance of the semiconductor device A6.

The semiconductor device A6 has the wiring layers similar to those of the semiconductor device A5. Specifically, the first conductive layer 14 of the wiring layers includes the first plate-like members 141, and each first plate-like member 141 has a pad portion 142. Thus, similarly to the semiconductor device A5, the wiring resistance of the first plate-like members 141 is reduced, and consequently the internal resistance of the semiconductor device A6 is reduced.

In addition, the semiconductor device A6 is similar to the semiconductor device A5 in that the connecting portion 311 of each first conductive member 31 overlaps, in plan view, with the center of the corresponding first plate-like member 141 in y direction. With this configuration, the distance to the connecting portion 311 from the far side edge of the first plate-like member 141 in plan view is reduced, as compared with a first conductive member 31 having a connecting portion 311 near a y-direction edge of the first plate-like member 141. In this way, the current path to each first plate-like member 141 is shortened, and consequently the internal resistance of the semiconductor device A6 is reduced.

Figure 15:
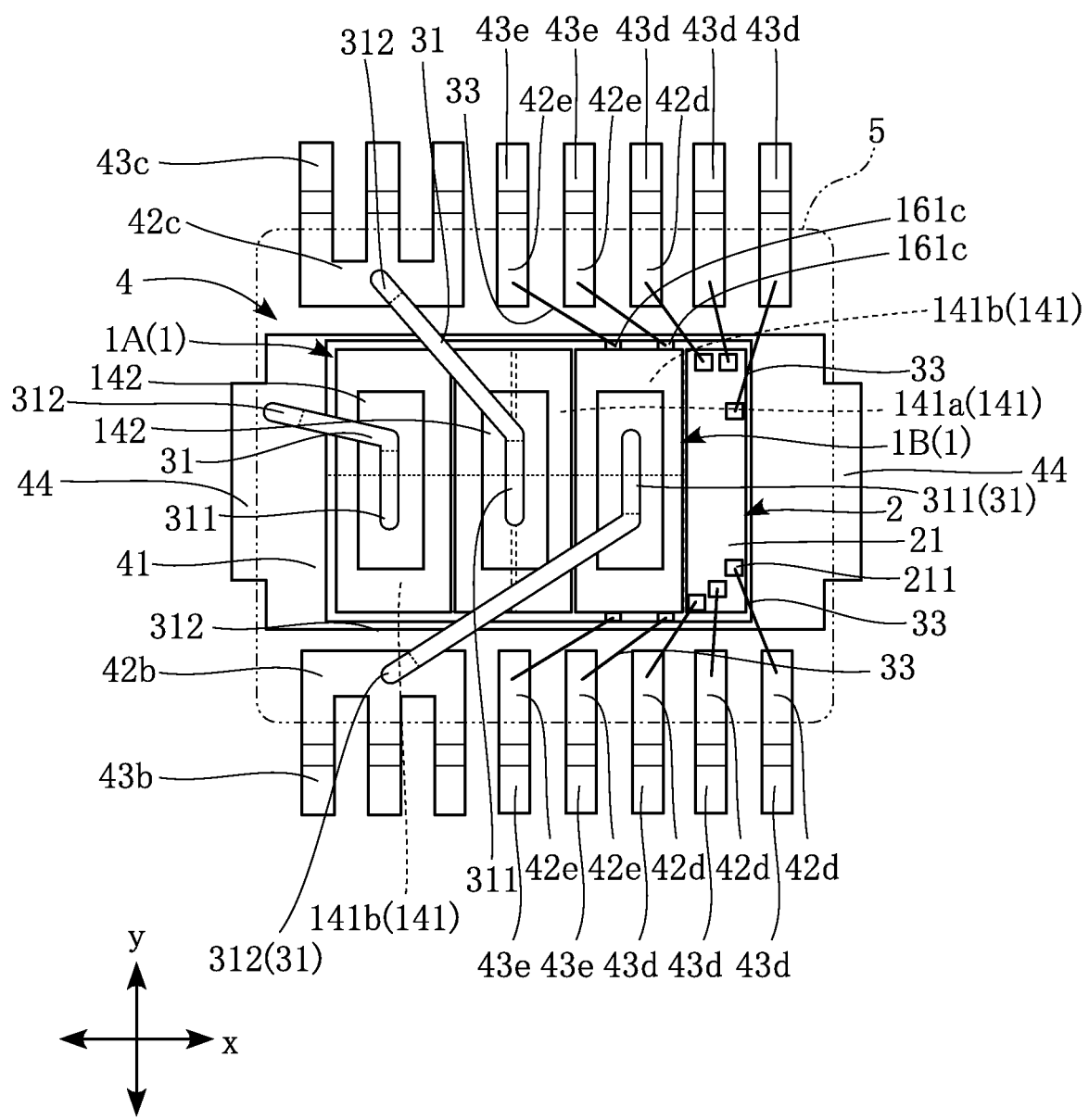
FIG. 15 is a plan view of a semiconductor device (omitting a sealing resin) according to a seventh embodiment.
Figure 16:
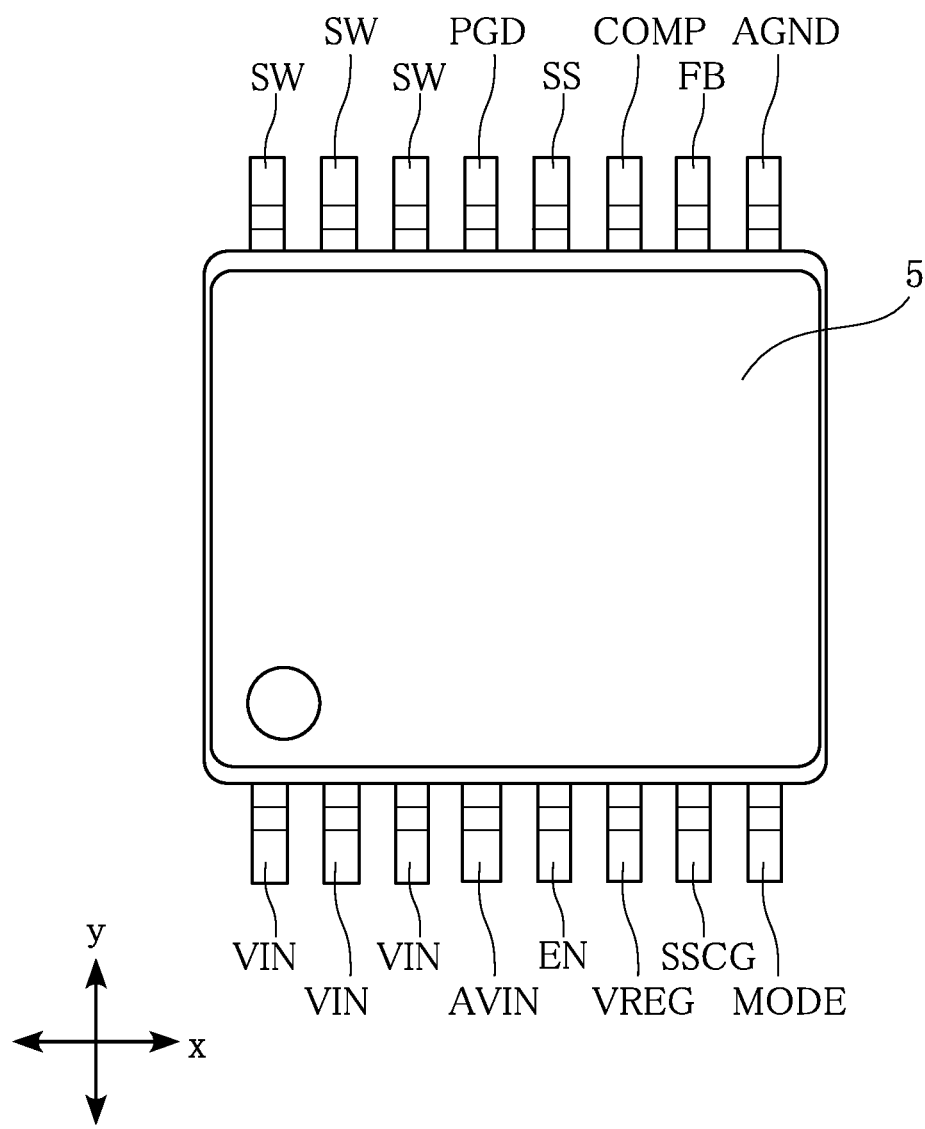
FIG. 16 is a plan view illustrating a terminal arrangement (first layout) of a semiconductor device according to the present disclosure.
Figure 17:
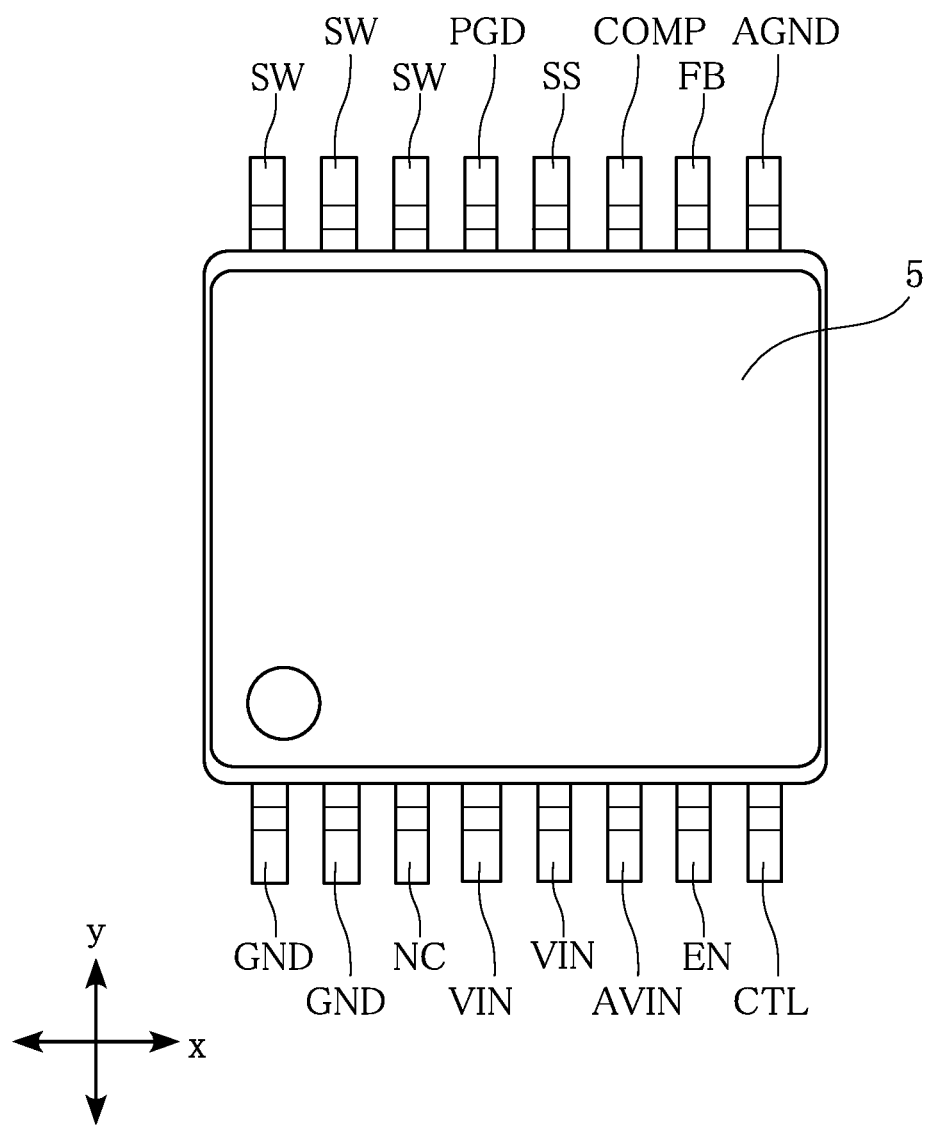
FIG. 17 is a plan view illustrating a terminal arrangement (second layout) of a semiconductor device according to the present disclosure.
Figure 18:
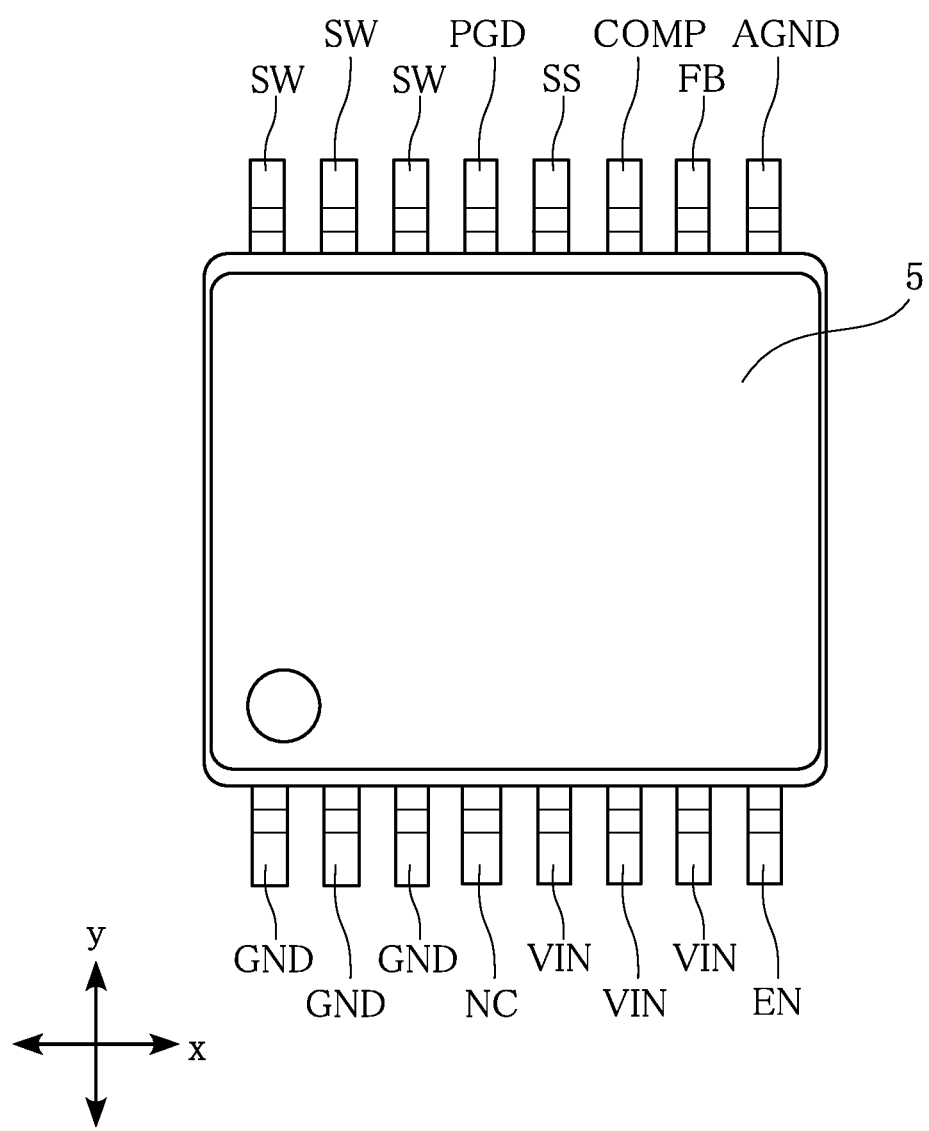
FIG. 18 is a plan view illustrating a terminal arrangement (third layout) of a semiconductor device according to the present disclosure.

FIG. 15 is a plan view of a semiconductor device A7 according to a seventh embodiment. FIG. 15 corresponds to FIG. 4 showing the semiconductor device A1 of the first embodiment. The semiconductor device A7 differs from the semiconductor device A5 mainly in the shape of the lead frame 4.

The lead frame 4 of this embodiment differs from the semiconductor device A4 in the locations of the side extension 44. In this embodiment, one side extension 44 extends from each of the opposite sides of the die pad portion 41 in the x direction, such that the side extension 44 is located at the middle of the die pad portion 41 in they direction. In addition, each side extension 44 extends beyond the edge of the sealing resin 5 in the x direction.

In this embodiment, one of the first conductive members 31 has a connecting portion 312 bonded to the die pad portion 41. In FIG. 15, the one first conductive member 31 that is bonded to the die pad portion 41 is bonded to the second electrode conducting member 141b. As described above, the second electrode conducting member 141b is electrically connected to the second electrodes 122 of the first semiconductor element 1A.

The third conductive members 33 of this embodiment may be Au or Cu wire, as in the sixth embodiment, or Al wire, as in the fifth embodiment.

As shown in FIG. 15, the first conductive layer 14 includes three first plate-like members 141 of the same width. Alternatively, the three first plate-like members 141 may have different widths from each other.

The semiconductor device A7 has the following configuration, which is similar to the semiconductor device A5. That is, the wiring layers formed over the first semiconductor elements 1 include pad portions 142. In addition, each first conductive member 31 has a connecting portion 311 bonded to a corresponding pad portion 142. With this configuration, each pad portion 142 is provided with a current path through the connecting portion 311 of a first conductive member 31. That is, the connecting portions 311 of the first conductive members 31 can provide bypass paths for the electric current to flow, instead of through the wiring layers. This helps to reduce the wiring resistance of the wiring layers, and consequently to reduce the internal resistance of the semiconductor device A7.

The semiconductor device A7 has the wiring layers similar to those of the semiconductor device A5. Specifically, the first conductive layer 14 of the wiring layers includes first plate-like members 141, and each first plate-like member 141 has a pad portion 142. Thus, similarly to the semiconductor device A5, the wiring resistance of the first plate-like members 141 is reduced, and consequently the internal resistance of the semiconductor device A7 is reduced.

In addition, the semiconductor device A7 is similar to the semiconductor device A5 in that the connecting portion 311 of each first conductive member 31 overlaps, in plan view, with the center of the corresponding first plate-like member 141 in y direction. With this configuration, the distance to the connecting portion 311 from the far side edge of the first plate-like member 141 in plan view is reduced, as compared with the first conductive member 31 having a connecting portion 311 near an y-direction edge of the first plate-like member 141. In this way, the current path to each first plate-like member 141 is shortened, and consequently the internal resistance of the semiconductor device A7 is reduced.

In the semiconductor device A7, the lead frame 4 has two side extensions 44 extending in the x direction from the opposite sides of the die pad portion 41 and located at the middle of the pad portion 41 in the y direction. However, this configuration is just one example without limitation. For example, the lead frame 4 may have side extensions similar to the side extensions 44 of the first to sixth embodiments. That is, each side extension 44 extends from the opposite side of the die pad portion 41 in the x direction, in alignment with an edge of the die pad portion 41 in they direction. Reversely, the semiconductor devices A1 to A6 may have side extensions 44 according to the seventh embodiment.

Figure 19:
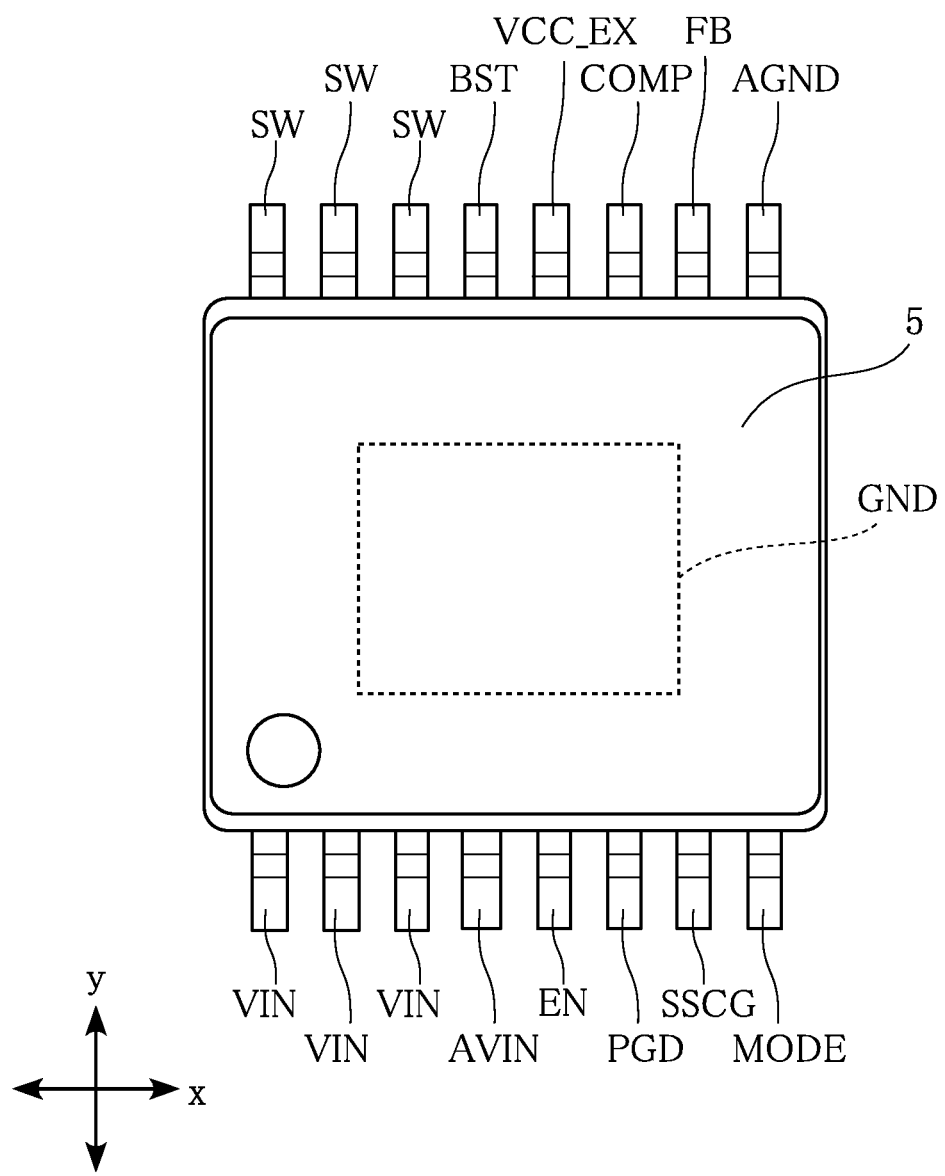
FIG. 19 is a plan view illustrating a terminal arrangement (fourth layout) of a semiconductor device according to the present disclosure.
Figure 20:
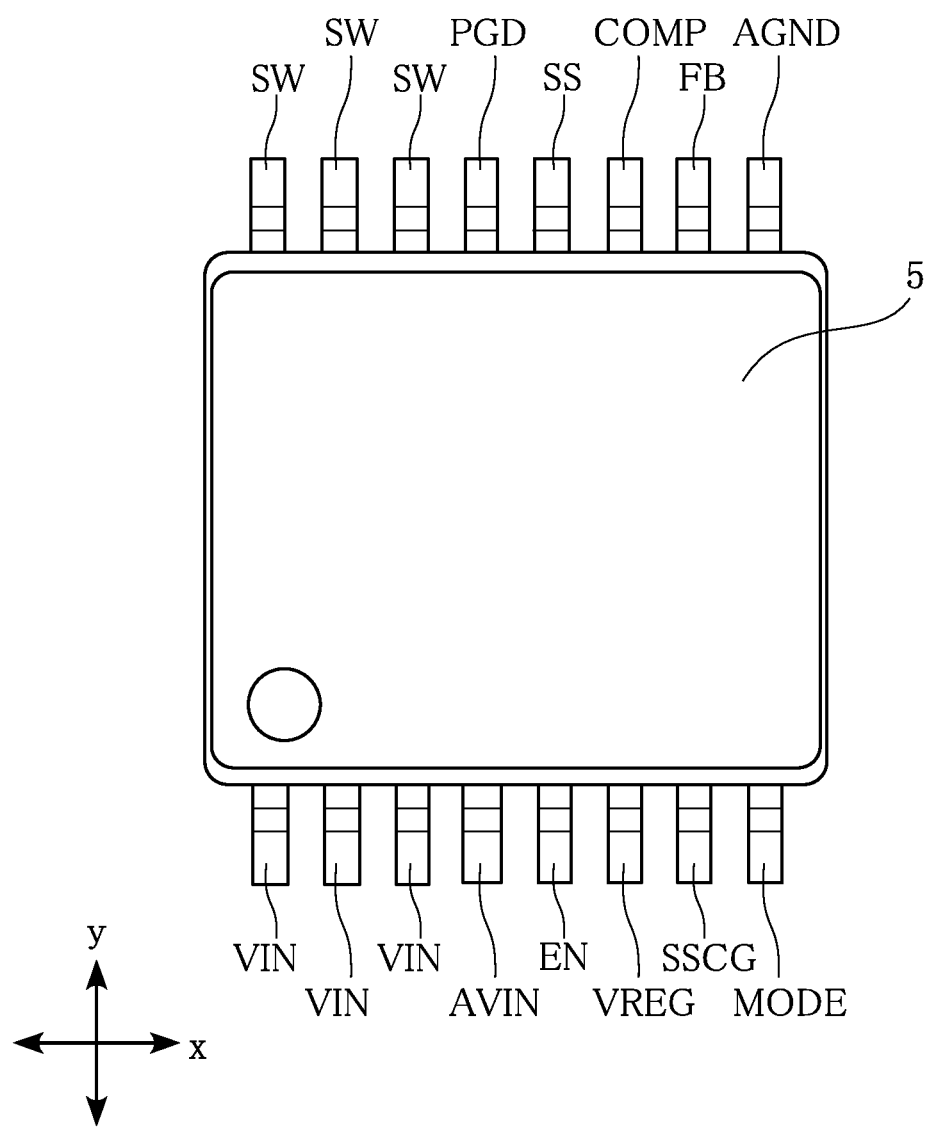
FIG. 20 is a plan view illustrating a terminal arrangement (fifth layout) of a semiconductor device according to the present disclosure.

The semiconductor devices A1 to A7 according to the first to seventh embodiments are not limited with respect to the terminal layout of the lead portions 43. FIGS. 16 to 20 show the terminal layouts according to other embodiments. The legends in these figures denote the following terminals. First of all, GND denotes a ground terminal, which in FIG. 19 is exposed on the bottom of the semiconductor device. VIN denotes a power supply input terminal. SW denotes a switching terminal. PGD denotes a Power Good terminal. EN denotes an enable terminal for controlling the device. AVIN denotes a power supply input terminal of the analog circuitry. AGND denotes a ground terminal for the analog circuitry. FB denotes an output voltage feedback terminal. SS denotes a terminal for setting the soft start time. SSCG denotes a terminal for spread spectrum setting. MODE denotes a terminal for switching control mode. VREG denotes an internal power supply output terminal. BST is an internal boost power output terminal. COMP denotes an ERRAMP output terminal. VCC_EX denotes an internal power supply output terminal. CTL denotes a control terminal of a various function. NC denotes a terminal that is not connected. The semiconductor devices of the present disclosure may have the lead portions 43 serving as the terminals shown in any of FIGS. 16 to 20, by appropriately changing the layout and/or shapes. The terminal layouts shown in FIGS. 16 to 20 are just some examples and without limitation.

Figure 21:
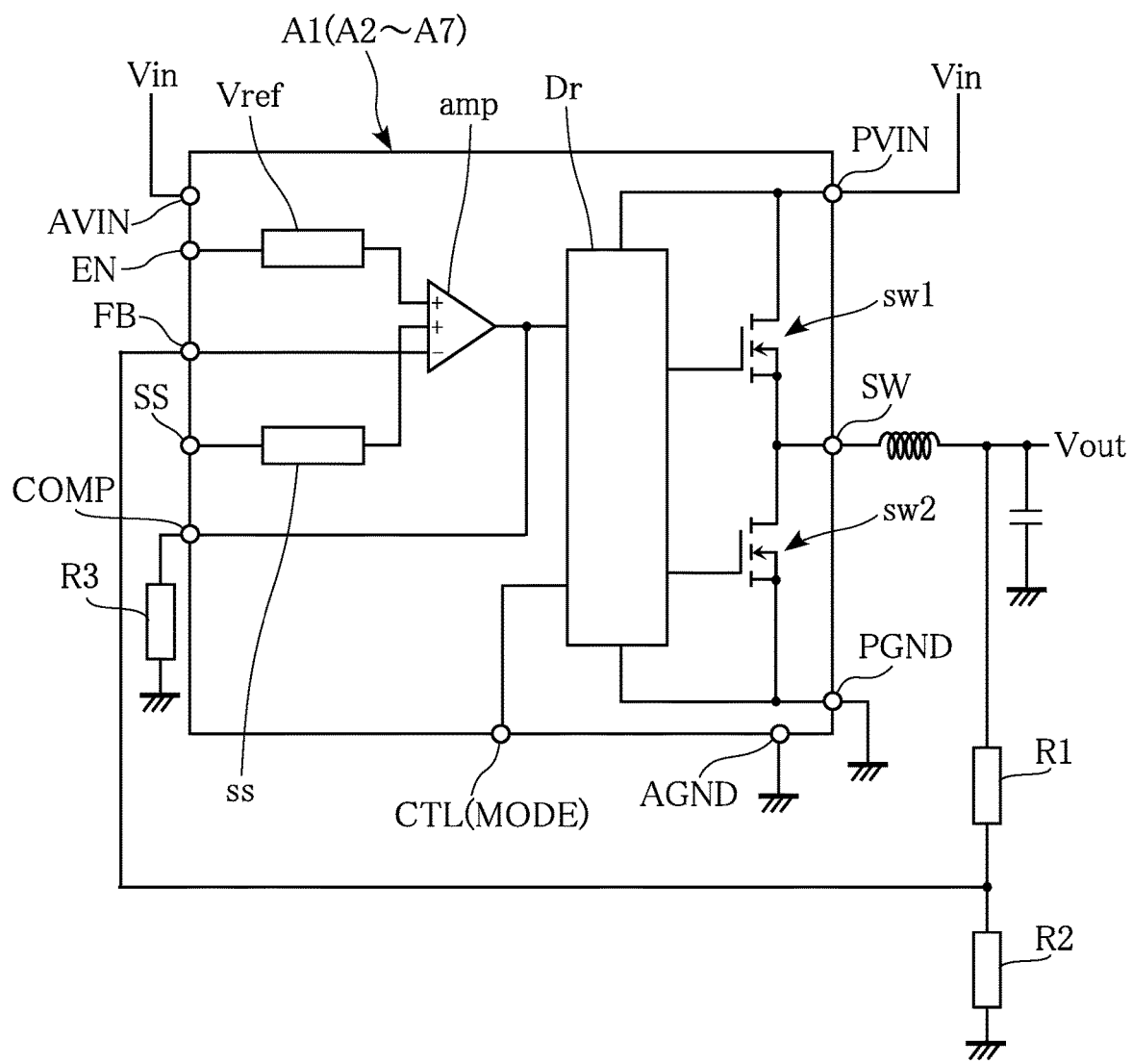
FIG. 21 is an example of a circuit diagram for a semiconductor device according to the present disclosure.

The semiconductor devices A1 to A7 according to the first to seventh embodiments may have any suitable circuit configuration, and one example is shown in FIG. 21. The circuit diagram shown in FIG. 21 is of the semiconductor devices A1 to A7 fabricated as a DC/DC converter. In FIG. 21, sw1 and sw2 denote switching elements. Dr denotes a control circuit for controlling the switching of the switching elements sw1 and sw2 and other protection functions. R1 to R3 denote resistors, Vref denotes an internal reference voltage circuit, ss denotes a soft-start circuit, amp denotes an error amplification circuit having inputs connected to Vref output voltage and FB terminal voltage. For example, one of the first semiconductor elements 1A and 1B corresponds to the switching element sw1, and the other to the switching element sw2. In addition, the second semiconductor element 2 corresponds to a circuit having the internal reference voltage circuit Vref, the soft-start circuit ss, the error amplification circuit amp and the control circuit Dr. Referring back to the figure, PVIN denotes the power supply input terminal of the DC/DC converter, and PGND denotes the ground terminal of the DC/DC converter.

Figure 22:
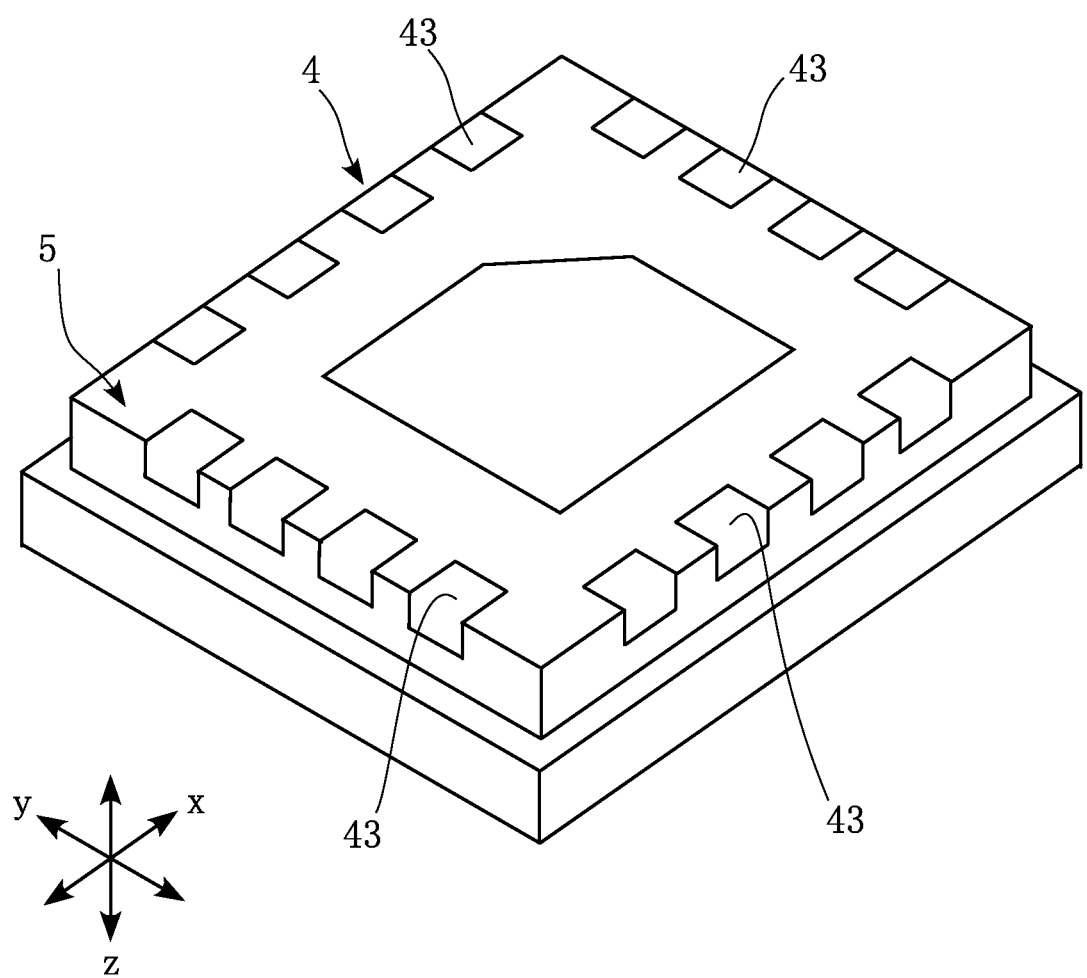
FIG. 22 is a perspective view of a semiconductor device according to a variation of the present disclosure.

The first to seventh embodiments are directed to the semiconductor devices A1 to A7 each of which is an SOP semiconductor device. Alternatively, the semiconductor devices A1 to A7 may be any of Quad Flat Package (QFP), Small Outline Non-leaded Package (SON), or even a leadless semiconductor package called Quad Flat Non-leaded Package (QFN). FIG. 22 is a perspective view of a QFN semiconductor device according to the present disclosure. Note that FIG. 22 shows the semiconductor device as seen from the bottom.

The first to seventh embodiments provide the semiconductor devices A1 to A7 each having a plurality of first semiconductor elements 1 and one second semiconductor element 2, but without limitation. For example, any of the semiconductor devices A1 to A7 may have a single first semiconductor element 1 and/or no second semiconductor element 2.

The semiconductor devices according to the present disclosure re not limited to specific embodiments described above. Various changes may be made to the specific components of the semiconductor devices of the present disclosure.

The invention claimed is:

1. A semiconductor device comprising:
   a semiconductor element that includes a semiconductor substrate, an element electrode and a wiring layer, the semiconductor substrate having a substrate main surface and a substrate rear surface that are spaced apart from each other in a first direction, the element electrode being formed on the substrate main surface, the wiring layer being formed on the substrate main surface and electrically connected to the element electrode;
   a lead frame supporting the semiconductor element;
   a first conductive member electrically connecting the semiconductor element and the lead frame;
   a second conductive member overlapping with the semiconductor element as viewed in the first direction;
   a sealing resin covering the semiconductor element, a part of the lead frame, the first conductive member and the second conductive member, wherein the wiring layer includes a first pad portion and a second pad portion that are spaced apart from each other, the second conductive member is a single, continuous member having a first connecting portion bonded to the first pad portion and a second connecting portion opposite to the first connecting portion and bonded to the second pad portion;

the first conductive member and the second conductive member are spaced apart from each other, and the second conductive member does not cross an outer edge of the semiconductor element as viewed in the first direction;

the wiring layer comprises a third pad portion spaced apart from the first pad portion and the first pad portion, and the first conductive member has a third connecting portion bonded to the third pad portion and a fourth connecting portion bonded to the lead frame, and at least a first conductive layer including at least a first plate-like member provided with the first pad portion, the second pad portion, and the third pad portion.

2. The semiconductor device according to claim 1, wherein the semiconductor element includes a protective layer formed on the wiring layer, and the first pad portion, the second pad portion and the third pad portion are exposed from the protective layer.

3. The semiconductor device according to claim 2, wherein the wiring layer includes at least the first conductive layer and a second conductive layer that are spaced apart from each other in the first direction, and the semiconductor element includes: an interlayer insulating film that insulate the first and second conductive layers from each other; and a plurality of vias formed through the interlayer insulating film and electrically connecting the first and second conductive layers to each other.

4. The semiconductor device according to claim 3, wherein the first conductive layer is covered by the protective layer, and the second conductive layer is located closer in the first direction to the substrate main surface than the first conductive layer.

5. The semiconductor device according to claim 4, wherein the first conductive layer includes a plurality of the first plate-like members each being rectangular as viewed in the first direction.

6. The semiconductor device according to claim 5, wherein the second conductive layer includes a plurality of second plate-like members each being rectangular as viewed in the first direction, and a number of the first plate-like members is smaller than a number of the second plate-like members.

7. The semiconductor device according to claim 6, wherein the first plate-like members are perpendicular to the second plate-like members.

8. The semiconductor device according to claim 7, wherein the wiring layer includes a third conductive layer located closer in the first direction to the substrate main surface than the second conductive layer.

9. The semiconductor device according to claim 8, wherein the third conductive layer includes a plurality of third plate-like members each being rectangular as viewed in the first direction, and the number of the second plate-like members is smaller than a number of the third plate-like members.

10. The semiconductor device according to claim 9, wherein the third plate-like members are perpendicular to the second plate-like members.

11. The semiconductor device according to claim 5, wherein the element electrode includes at least a first electrode and a second electrode, and the first plate-like members include a first electrode conducting member electrically connected to the first electrode and a second electrode conducting member electrically connected to the second electrode.

12. The semiconductor device according to claim 1, wherein the second conductive member comprises a wire having a circular cross section.

13. The semiconductor device according to claim 12, wherein the first conductive member comprises a wire having a circular cross section, and the first conductive member and the second conductive member have a same diameter.

14. The semiconductor device according to claim 1, wherein the first conductive member and the second conductive member contain aluminum.

15. The semiconductor device according to claim 1, wherein the semiconductor element comprises a MOSFET.

16. The semiconductor device according to claim 1, further comprising:
a control IC for controlling operation of the semiconductor element; and
a third conductive member connecting the control IC and the lead frame.

17. The semiconductor device according to claim 16, wherein the third conductive member is thinner than the first conductive member.

18. A semiconductor device comprising:
a semiconductor element including a semiconductor substrate, an element electrode and a wiring layer, the semiconductor substrate having a substrate main surface and a substrate rear surface that are spaced apart from each other in a first direction, the element electrode being formed on the substrate main surface, the wiring layer being formed on the substrate main surface and electrically connected to the element electrode;
a lead frame supporting the semiconductor element;
a first conductive member electrically connecting the semiconductor element and the lead frame;
a second conductive member spaced apart from the first conductive member;
a sealing resin covering the semiconductor element, a part of the lead frame and the conductive members, wherein the wiring layer includes a rectangular plate-like member elongated in a second direction perpendicular to the first direction,
the first conductive member has a first connecting portion bonded to the plate-like member, the first connecting portion being elongated in a longitudinal direction of the plate-like member as viewed in the first direction and overlapping with a longitudinal center of the plate-like member as viewed in the first direction, the first connecting portion being bonded to the plate-like member in a manner such that an axis of the first connecting portion is parallel to the second direction, and
the second conductive member having a second connecting portion bonded to the plate-like member, the second connecting being elongated in the longitudinal direction of the plate-like member as viewed in the first direction and overlapping with the longitudinal center of the plate-like member as viewed in the first direction.

* * * * *